(12) United States Patent
Hamazawa

(10) Patent No.: US 9,704,985 B2
(45) Date of Patent: Jul. 11, 2017

(54) SEMICONDUCTOR DEVICE INCLUDING A CHANNEL REGION AND METHOD FOR MANUFACTURING THE SEMICONDUCTOR DEVICE

(71) Applicant: ROHM CO., LTD., Kyoto (JP)

(72) Inventor: Yasushi Hamazawa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/291,724

(22) Filed: May 30, 2014

(65) Prior Publication Data
US 2014/0353746 A1 Dec. 4, 2014

(30) Foreign Application Priority Data

Jun. 4, 2013 (JP) ................................ 2013-118152

(51) Int. Cl.
| | |
|---|---|
| H01L 29/78 | (2006.01) |
| H01L 21/8238 | (2006.01) |
| H01L 21/84 | (2006.01) |
| H01L 27/092 | (2006.01) |
| H01L 27/12 | (2006.01) |

(52) U.S. Cl.
CPC .. *H01L 29/7813* (2013.01); *H01L 21/823821* (2013.01); *H01L 21/845* (2013.01); *H01L 27/0922* (2013.01); *H01L 27/1203* (2013.01); *H01L 27/1211* (2013.01)

(58) Field of Classification Search
CPC ........... H01L 21/823821; H01L 21/845; H01L 27/1211; H01L 29/7813
See application file for complete search history.

(56) References Cited

U.S. PATENT DOCUMENTS

| 5,424,247 A | 6/1995 | Sato | |
|---|---|---|---|
| 6,413,802 B1 * | 7/2002 | Hu et al. ....................... | 438/151 |

(Continued)

FOREIGN PATENT DOCUMENTS

JP   H05-41457 A   2/1993

OTHER PUBLICATIONS

Merriam-Webster online dictionary, Mar. 3, 2016, Definition of "dot", http://www.merriam-webster.com/dictionary/dot.*

(Continued)

*Primary Examiner* — Tucker J Wright
(74) *Attorney, Agent, or Firm* — Rabin & Berdo, P.C.

(57) ABSTRACT

A semiconductor device of the present invention includes a semiconductor layer, a source region and a drain region formed in a surface of the semiconductor layer, both having a first conductivity type, a plurality of gate trenches each formed so as to extend across the source region and the drain region, in a plan view observed in a direction of a normal to the surface of the semiconductor layer, a channel region of a first conductivity type made of the semiconductor layer sandwiched by the gate trenches adjacent to each other, having a channel length along a direction extending from the drain region to the source region, and a gate electrode buried in the gate trench via a gate insulating film, and the channel region has a thickness in the plan view not more than two times a width of a depletion layer to be generated due to a built-in potential between the channel region and the gate electrode.

23 Claims, 21 Drawing Sheets

(56) References Cited

U.S. PATENT DOCUMENTS

| | | | |
|---|---|---|---|
| 2005/0056892 A1* | 3/2005 | Seliskar | H01L 21/84 257/348 |
| 2005/0266645 A1* | 12/2005 | Park | H01L 29/1033 438/282 |
| 2006/0281268 A1* | 12/2006 | Colinge et al. | 438/301 |
| 2009/0001471 A1* | 1/2009 | Ohmi et al. | 257/351 |

OTHER PUBLICATIONS

Akio Nakagawa et al., "Improved 20V Lateral Trench Gate Power MOSFETs with Very Low On-Resistance of 7.8 mΩmm$^2$", 2000 Proceedings of The 12th International Symposium on Power Semiconductor Devices and ICs, ISPSD'2000, May 22-25, 2000, Toulouse, France, pp. 47-50.

* cited by examiner

SEMICONDUCTOR DEVICE INCLUDING A CHANNEL REGION AND METHOD FOR MANUFACTURING THE SEMICONDUCTOR DEVICE

CROSS-REFERENCE TO RELATED APPLICATIONS

The present application corresponds to Japanese Patent Application No. 2013-118152 filed on Jun. 4, 2013 in the Japan Patent Office, and the entire disclosure of this application is incorporated herein by reference.

FIELD OF THE INVENTION

The present invention relates to a semiconductor device having a trench gate structure and a method for manufacturing the same.

BACKGROUND ART

Patent Document 1 (Japanese Patent Application Publication No. 5-41457) discloses a semiconductor device including a pair of n$^+$ diffusion layers formed at an interval from each other in the surface of a semiconductor substrate and a gate electrode formed on the semiconductor substrate via a gate insulating film.

BRIEF SUMMARY OF THE INVENTION

In such a semiconductor device as in Patent Document 1, when a positive potential is applied to the gate electrode, electrons that are minority carriers in the semiconductor substrate are attracted to the gate electrode, and an inversion layer to electrically connect between the source region and drain region is formed at a position opposed to the gate electrode in the semiconductor substrate. A current can thereby be caused to flow in the source region and drain region. Then, when the voltage being applied to the gate electrode is cancelled, the inversion layer disappears to allow disconnection of the current flowing in the inversion layer.

However, a MOSFET using an inversion layer as a channel as in Patent Document 1 has a problem that a dynamic resistance value (electric resistance value when the MOSFET is on) is high because the physical thickness of the channel is very thin. Also, the carrier mobility in the inversion layer, which is lower than the carrier mobility in ordinary silicon, is therefore a cause for a higher dynamic resistance value.

The problem of the dynamic resistance value may be solved by geometrically increasing the width of the gate electrode (channel width), but in this case, the semiconductor element increases in size, and a problem of an increase in manufacturing cost newly occurs.

Therefore, it is an object of the present invention to provide a semiconductor device and a method for manufacturing the same that can prevent an increase in the size of the semiconductor element, while reducing the dynamic resistance value.

BRIEF DESCRIPTION OF THE DRAWINGS

FIGS. 5A and 5B show schematic sectional views for explaining the operation when the semiconductor device is on.

FIG. 19A shows schematic sectional view of a semiconductor device according to a seventh preferred embodiment of the present invention.

FIG. 19B shows schematic sectional view of a semiconductor device according to a seventh preferred embodiment of the present invention.

DETAILED DESCRIPTION OF THE INVENTION

Figure 1:
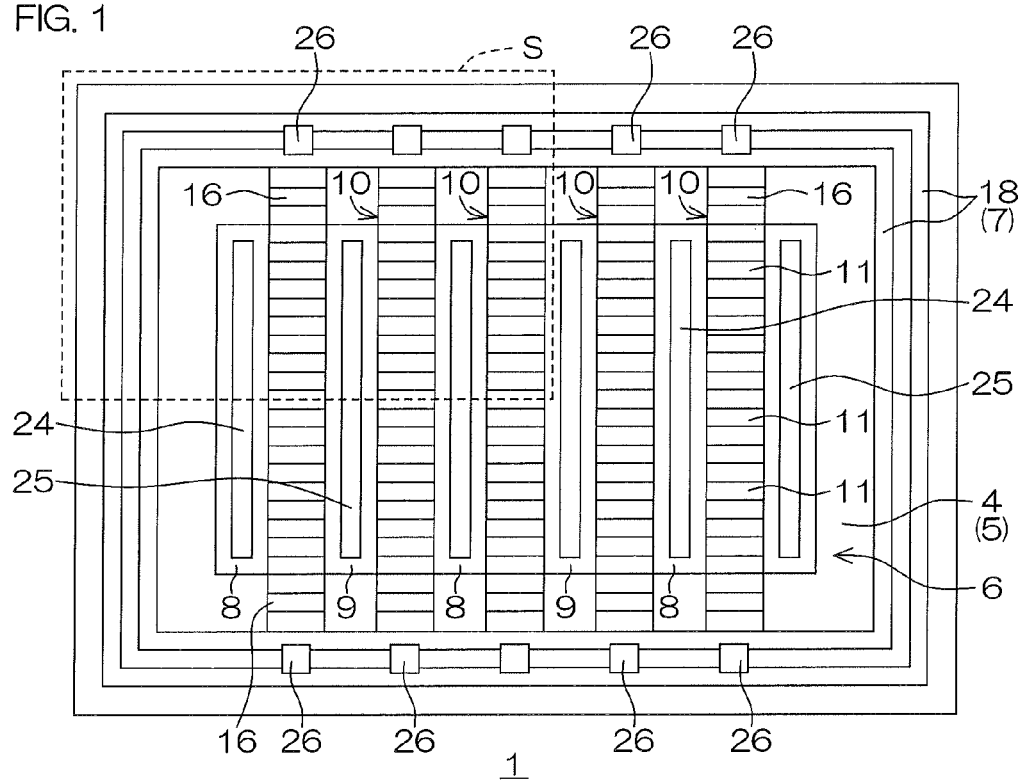
FIG. 1 is a schematic plan view of a semiconductor device according to a first preferred embodiment of the present invention.

The constitution of a semiconductor device and a method for manufacturing the same of the present invention will be disclosed in the following.

A device according to a first aspect of the present invention includes a semiconductor layer, a source region and a drain region formed transversally spaced apart in a surface of the semiconductor layer, both having a first conductivity type, a plurality of gate trenches each formed so as to extend across the source region and the drain region and arrayed at an interval from each other, in a plan view observed in a direction of a normal to the surface of the semiconductor layer, a channel region of a first conductivity type made of the semiconductor layer sandwiched by the gate trenches adjacent to each other, having a channel length along a direction extending from the drain region to the source region, and a gate electrode buried in the gate trench via a gate insulating film, and the channel region has a thickness in the plan view not more than two times a width of a depletion layer to be generated by a built-in potential between the channel region and the gate electrode.

According to the device according to the first aspect of the present invention, when the semiconductor device is off (when a voltage is not applied to the gate electrodes), due to a built-in potential between the channel region and the gate electrode, a depletion layer is formed in a manner expanding toward the semiconductor layer (channel region) from the gate electrode. At this time, because the thickness of the channel region in a plan view is not more than two times the width of the depletion layer, as a result of the depletion layers expanding from the adjacent gate electrodes overlapping each other in the channel region, the channel region is fully depleted to be electrically disconnected. That is, the device according to the first aspect of the present invention can provide a normally-off semiconductor device.

On the other hand, when the semiconductor device is on (when a voltage is applied to the gate electrodes), the depletion layers can be made to diminish or disappear to make the channel region conduct. Furthermore, because an inversion layer is not used for the channel as in the conventional MOSFET, not only carrier mobility degradation unique to an inversion layer can be suppressed, but the channel thickness can also be made relatively thick. Carrier mobility degradation unique to an inversion layer can thereby be suppressed. As a result, a semiconductor device having a low dynamic resistance value can be provided.

As semiconductor devices using a method not using an inversion layer, SITs (Static Induction Transistors) and junction FETs (Field-Effect Transistors) can be mentioned.

In these semiconductor devices, gate diffusion regions facing each other are formed in a semiconductor substrate. A voltage to the gate diffusion regions is controlled to thereby open and close a channel region made of a part of the semiconductor substrate formed between said regions by depletion layers. Therefore, the channel width can be wide, and also, because there is no carrier mobility degradation unique to an inversion layer, the electric resistance value of the channel can be reduced.

However, because the gate regions are formed by impurity diffusion, a planar pattern may be increased for forming the gate regions deeply. Thus, in the SITs and junction FETs, there is a problem that minute formation cannot be performed to result in considerably large-sized semiconductor elements. Further, there is also a fundamental problem that the SITs and junction FETs are semiconductor devices that are based on being normally on, in which a current flows even in a state where a voltage is not applied, and are therefore extremely poor in usability.

In contrast, according to the device according to the first aspect of the present invention, unlike the SITs and junction FETs, because the gate electrode is buried in the gate trench via the gate insulating film, impurity diffusion is delimited by the gate insulating film.

Because an increase in the planar pattern can thereby be suppressed, the semiconductor element can be miniaturized in size. As a result, a large channel width can be secured per unit area. Alternatively, the channel width can also be increased by deeply forming the gate trench.

In this manner, according to the device according to the first aspect of the present invention, the multiple weaknesses of the SITs, junction FETs, and MOSFETs can be simultaneously solved. Furthermore, according to the device according to the first aspect of the present invention, because of being a lateral semiconductor device that allows extremely easy mixed mounting as an LSI, a semiconductor device having an extremely high affinity with other semiconductor elements can be provided.

Also, a device according to a second aspect of the present invention is the device according to the first aspect, in which the interval of the gate trenches adjacent to each other is constant along their depth direction.

According to the device according to the second aspect of the present invention, the depletion layers expanding from the respective gate trenches adjacent to each other can be overlapped mutually and reliably in the channel region. As a result, a satisfactory normally-off operation can be realized.

Also, a device according to a third aspect of the present invention is the device according to the first or second aspect, in which the source region and the drain region consists of a plurality of layers including a surface layer exposed to the surface of the semiconductor layer and a buried layer formed at an interval lower than the surface layer.

According to the device according to the third aspect of the present invention, the source region and the drain region can also be distributed in the depth direction of the semiconductor layer. Because electric lines of force in the source region and electric lines of force in the drain region can thereby be distributed uniformly between the surface layer and buried layer of each, variation in current flowing through the source region and the drain region can be effectively suppressed. As a result, an increase in dynamic resistance value of the semiconductor device can be effectively suppressed.

Also, it is preferable that a plurality of the buried layers are formed at an interval from each other until reaching a bottom portion of the gate trench, as in a device according to a fourth aspect of the present invention.

Also, a device according to a fifth aspect of the present invention is the device according to the first or second aspect, in which the source region and the drain region are formed evenly until reaching a bottom portion of the gate trench from the surface of the semiconductor layer.

According to the device according to the fifth aspect of the present invention, electric lines of force in the source region and electric lines of force in the drain region can thereby be distributed uniformly thoroughly from the surface of the semiconductor layer to the bottom portion of the gate trench. Variation in current flowing through the source region and the drain region can thereby be effectively suppressed. As a result, an increase in dynamic resistance value of the semiconductor device can be effectively suppressed.

Also, it is preferable that the source region and the drain region are made of polysilicon buried in the semiconductor layer, as in a device according to a sixth aspect of the present invention.

Also, a device according to a seventh aspect of the present invention is the device according to any one of the first to sixth aspects, in which the drain region is formed so as to have a predetermined interval with an end portion of the gate trench.

Also, according to the device according to the seventh aspect of the present invention, a depletion layer also expands into the region between the end portions of the respective gate trenches and the drain region, dependence of a drain-gate withstand voltage of the semiconductor device on the thickness of the gate insulating film can be suppressed. As a result, the withstand voltage of the semiconductor device can be improved.

Also, the source region and the drain region may be each formed so as to contact an end portion of the gate trench, as in a device according to an eighth aspect of the present invention.

Also, a device according to a ninth aspect of the present invention is the device according to any one of the first to eighth aspects, in which the semiconductor layer is made of n-type silicon, and the gate electrode is made of p-type polysilicon.

Also, a device according to a tenth aspect of the present invention is the device according to any one of the first to ninth aspects, in which the plurality of gate trenches are constructed by gate trenches formed in dot shapes having a length corresponding to the channel length that are arrayed at equal intervals.

According to the device according to the tenth aspect of the present invention, the respective channel regions are formed substantially equal in depth and shape. As a result, variation in channel thickness and carrier mobility between the respective channel regions can be effectively suppressed.

Also, a device according to an eleventh aspect of the present invention is the device according to any one of the first to tenth aspects, in which the semiconductor layer is made of an SOI substrate including a support substrate and an active layer stacked on the support substrate via a BOX layer, and the gate trench is formed so as to reach the BOX layer from a surface of the active layer.

According to the device according to the eleventh aspect of the present invention, the active layer sandwiched by adjacent gate trenches serves as a channel region. At this time, the gate trench is formed so as to reach the BOX layer that completely separates the support substrate and the active layer, and can therefore effectively suppress the source region and the drain region from conducting via a lower portion of the active layer.

Also, a device according to a twelfth aspect of the present invention is the device according to any one of the first to tenth aspects, in which the semiconductor layer is made of a substrate including a second conductivity-type semiconductor layer and a first conductivity-type well formed in the second semiconductor-type semiconductor layer, and the gate trench is formed so as to reach the second conductivity-type semiconductor layer, penetrating through the first conductivity-type well.

According to the device according to the twelfth aspect of the present invention, the first conductivity-type well sandwiched by adjacent gate trenches serves as a channel region. At this time, the gate trench is formed penetrating through the first conductivity-type well so as to reach the second conductivity-type semiconductor layer having an opposite polarity, and can therefore effectively suppress the source region and the drain region from conducting via a lower portion of the first conductivity-type well.

Also, according to the device according to the twelfth aspect of the present invention, unlike the device according to the eleventh aspect described above, because it is unnecessary to form a BOX layer, the manufacturing process can be accordingly simplified. As a result, a semiconductor device can be manufactured at relatively low cost.

Also, a device according to a thirteenth aspect of the present invention is the device according to the twelfth aspect, in which the second conductivity-type semiconductor layer includes a substrate and an epitaxial layer formed with the first conductivity-type well, having a lower concentration than that of the substrate, and the epitaxial layer includes a high-concentration region formed in a region to contact the gate trench, having an impurity concentration higher than that of a region other than the region to contact the gate trench in the epitaxial layer.

According to the device according to the thirteenth aspect of the present invention, in a part where the gate trench and the epitaxial layer are in contact, penetration of the second conductivity-type impurities doped into the epitaxial layer into a gate insulating film to be formed in the following step can be effectively suppressed. An inversion of the epitaxial layer at the part to contact the said gate insulating film to the first conductivity type can thereby be suppressed. As a result, the source region and the drain region can be effectively suppressed from conducting via the epitaxial layer.

Also, a method according to a fourteenth aspect of the present invention includes a step of forming a plurality of gate trenches at an interval from each other in a first conductivity-type region of a semiconductor layer selectively having the first conductivity-type region, a step of burying a gate electrode in the gate trench via a gate insulating film, and a step of forming a drain region of a first conductivity type extending across a plurality of gate trenches at a one-end side of the plurality of gate trenches and forming a source region of a first conductivity type extending across the plurality of gate trenches at the other-end side of the plurality of gate trenches by doping impurity ions of a first conductivity type into the semiconductor layer so that, in a plan view observed in a direction of a normal to a surface of the semiconductor layer, the first conductivity-type region sandwiched by the gate trenches adjacent to each other becomes a channel region having a channel length along a direction extending from one end to the other end of the gate trench, and the step of forming the plurality of gate trenches includes a step of forming the gate trench so that the channel region has a thickness in the plan view not more than two times a width of a depletion layer to be generated by a built-in potential between the channel region and the gate electrode.

According to the method according to the fourteenth aspect of the present invention, a semiconductor device that provides the same effects as those described regarding the device according to the first aspect described above can be manufactured.

Also, a method according to a fifteenth aspect of the present invention is the method according to the fourteenth aspect, in which the step of forming the source region and the drain region includes a step of forming a surface layer exposed to the surface of the semiconductor layer by doping impurity ions of a first conductivity type into the semiconductor layer at a first acceleration energy, and a step of forming a buried layer lower than the surface layer by doping impurity ions of a first conductivity type into the semiconductor layer at a second acceleration energy higher than the first acceleration energy.

According to the method according to the fifteenth aspect of the present invention, a semiconductor device that provides the same effects as those described regarding the device according to the third aspect described above can be manufactured.

Also, a method according to a sixteenth aspect of the present invention is the method according to the fifteenth aspect, in which the step of forming the buried layer includes a step of forming a plurality of the buried layers so as to have an interval from each other until reaching a bottom portion of the gate trench by changing the second acceleration energy in steps.

According to the method according to the sixteenth aspect of the present invention, a semiconductor device that provides the same effects as those described regarding the device according to the fourth aspect described above can be manufactured.

Also, a method according to a seventeenth aspect of the present invention includes a step of forming a source trench and a drain trench at an interval from each other in a first conductivity-type region of a semiconductor layer selectively having the first conductivity-type region, a step of forming a source region and drain region made of polysilicon of a first conductivity type by burying the polysilicon in the source trench and the drain trench, and a step of forming a plurality of gate trenches at an interval from each other so that each extends across the source region and the drain region in a plan view observed in a direction of a normal to a surface of the semiconductor layer, and simultaneously, forming a channel region made of the first conductivity-type region sandwiched by the gate trenches adjacent to each other, having a channel length along a direction extending from the drain region to the source region, and the step of forming the plurality of gate trenches includes a step of forming the gate trench so that the channel region has a thickness in the plan view not more than two times a width of a depletion layer to be generated by a built-in potential between the channel region and the gate electrode.

According to the method according to the seventeenth aspect of the present invention, electric lines of force in the source region and electric lines of force in the drain region can be distributed uniformly in the polysilicon buried thoroughly from the surface of the semiconductor layer to the bottom portion of the gate trench. Because variation in current flowing through the source region and the drain region can thereby be effectively suppressed, a semiconductor device that can effectively suppress an increase in dynamic resistance value of the semiconductor device can be manufactured.

Also, a method according to an eighteenth aspect of the present invention is the method according to any one of the methods according to the fourteenth to seventeenth aspects, in which the step of forming the plurality of gate trenches includes a step of forming the gate trenches adjacent to each other with a constant interval therebetween along their depth direction.

According to the method according to the eighteenth aspect of the present invention, because depletion layers expanding from the whole area of the side surfaces of the respective gate trenches toward the channel region overlap mutually and reliably in the channel region, a semiconductor device that can realize a satisfactory normally-off operation can be manufactured.

Also, a method according to a nineteenth aspect of the present invention is the method according to any one of the methods according to the fourteenth to eighteenth aspects, in which the semiconductor layer is made of an SOI substrate including a support substrate and an active layer stacked on the support substrate via a BOX layer to provide the first conductivity-type region, and the step of forming the plurality of gate trenches includes a step of forming the gate trench so as to reach the BOX layer from a surface of the active layer.

According to the method according to the nineteenth aspect of the present invention, a semiconductor device that provides the same effects as those described regarding the device according to the eleventh aspect described above can be manufactured.

Also, a method according to a twentieth aspect of the present invention is the method according to any one of the methods according to the fourteenth to eighteenth aspects, in which the semiconductor layer is made of a substrate including a second conductivity-type semiconductor layer and a first conductivity-type well formed in the second semiconductor-type semiconductor layer to provide the first conductivity-type region, and the step of forming the plurality of gate trenches includes a step of forming the gate trench so as to reach the second conductivity-type semiconductor layer, penetrating through the first conductivity-type well.

According to the method according to the twentieth aspect of the present invention, a semiconductor device that provides the same effects as those described regarding the device according to the twelfth aspect described above can be manufactured.

Also, a method according to a twenty-first aspect of the present invention is the method according to the twentieth aspect, in which the second conductivity-type semiconductor layer includes a substrate and an epitaxial layer formed with the first conductivity-type well, having a lower concentration than that of the substrate, and the method for manufacturing a semiconductor device further comprises a step of doping impurity ions of a second conductivity type into the epitaxial layer exposed to the gate trench after formation of the plurality of gate trenches.

According to the method according to the twenty-first aspect of the present invention, a semiconductor device that provides the same effects as those described regarding the device according to the thirteenth aspect described above can be manufactured.

Hereinafter, preferred embodiments of the present invention will be described in detail with reference to the accompanying drawings.

Figure 2:
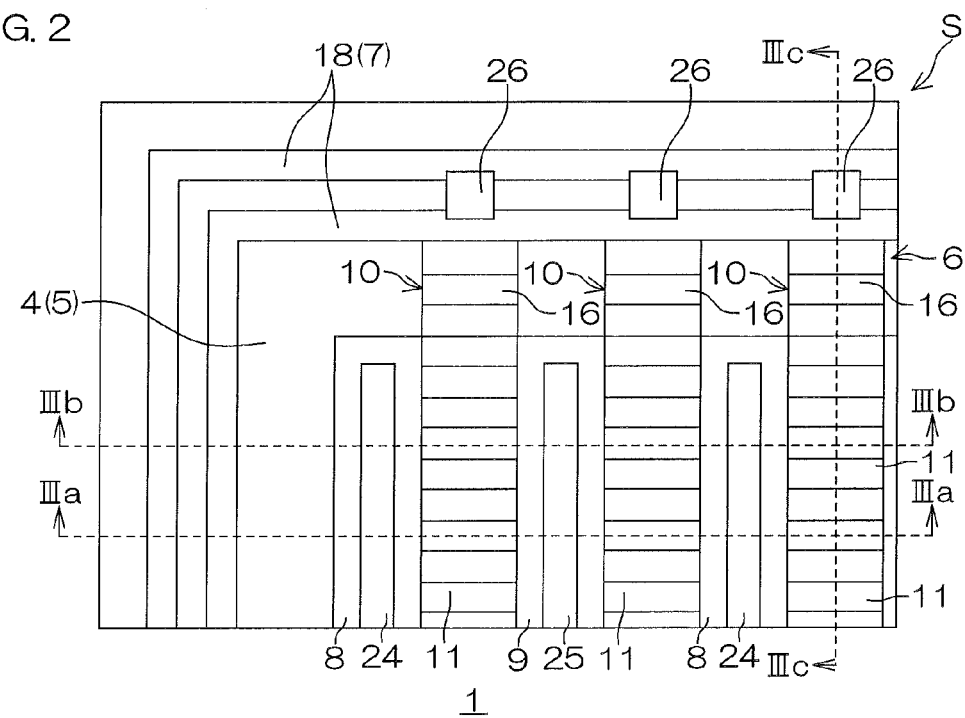
FIG. 2 is an enlarged schematic plan view of the semiconductor device.
Figure 3A:
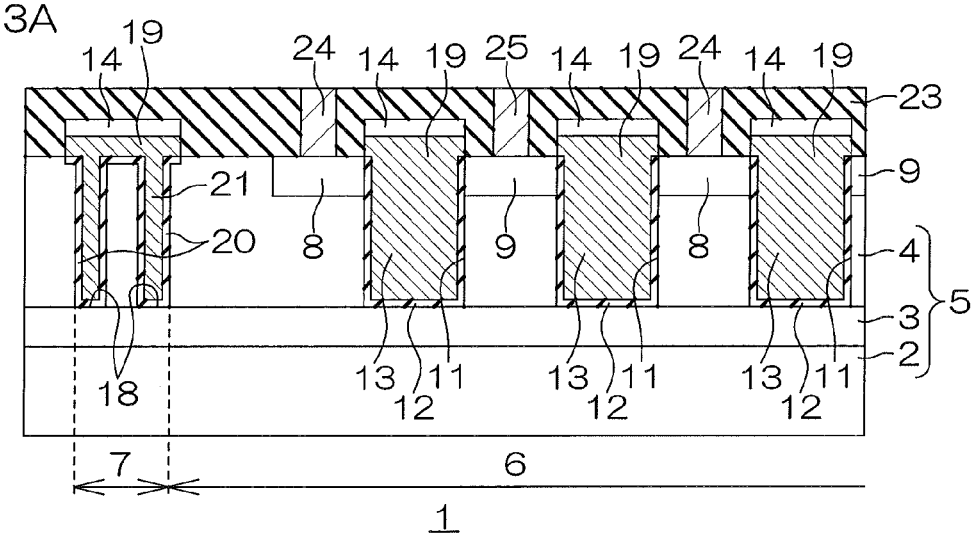
FIG. 3A shows sectional view taken along section line IIIa-IIIa in FIG. 2.
Figure 3B:
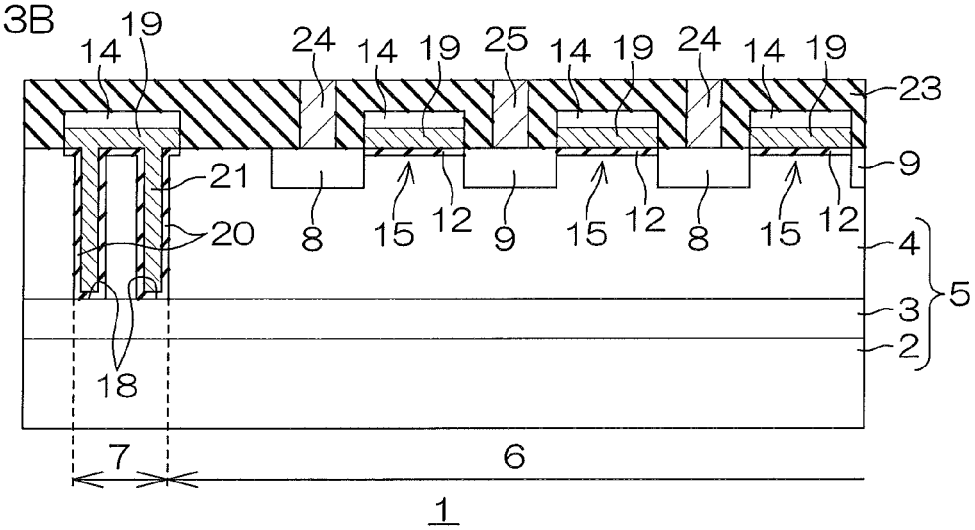
FIG. 3B shows sectional view taken along section line IIIb-IIIb in FIG. 2.
Figure 3C:
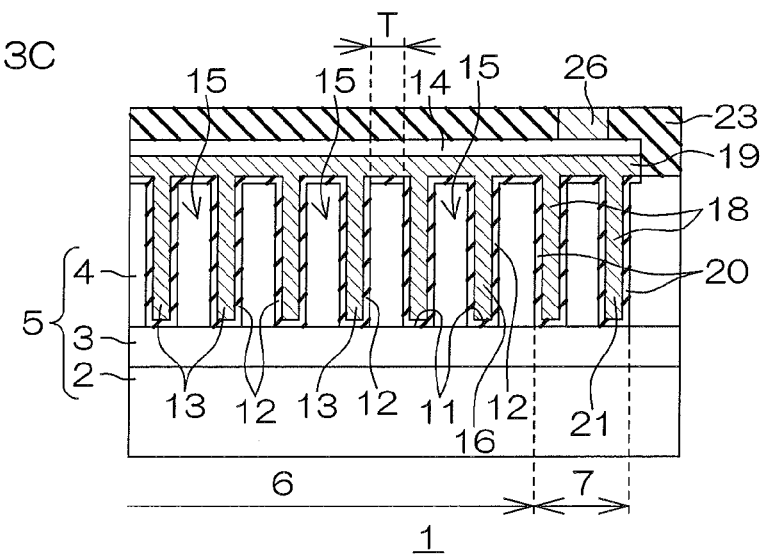
FIG. 3C shows sectional view taken along section line IIIc-IIIc in FIG. 2.

FIG. 1 is a schematic plan view of a semiconductor device 1 according to a first preferred embodiment of the present invention. Also, FIG. 2 is an enlarged schematic plan view of the semiconductor device 1. Also, FIGS. 3A to 3C show sectional views taken along respective section lines in FIG. 2, in which FIG. 3A corresponds to a section line IIIa-IIIa, FIG. 3B corresponds to a section line IIIb-IIIb, and FIG. 3C corresponds to a section line IIIc-IIIc. In addition, FIG. 2 is a view of a region S enclosed by a broken line of FIG. 1, enlarged.

The semiconductor device 1 includes an SOI (Silicon On Insulator) substrate 5 being an example of a semiconductor layer of the present invention. The SOI substrate 5 includes a p-type semiconductor substrate 2, a BOX layer 3 formed on the semiconductor substrate 2, and an n⁻-type active layer 4 formed on the BOX layer 3. The semiconductor substrate 2 is a p-type silicon substrate in the range of general use, and is not restricted in specification.

The BOX layer 3 is, for example, a buried insulating film including silicon oxide formed by oxidizing the surface of the semiconductor substrate 2, and is formed with a thickness of 0.5 μm to 1.5 μm. In addition, the thickness of the BOX layer 3 can be appropriately changed according to the specification (for example, working voltage) of the semiconductor substrate 1, and may be formed thinner or may be formed thicker.

The n⁻-type active layer 4 is formed with a layer thickness of 0.5 μm to 5.0 μm on the BOX layer 3. The impurity concentration of the n⁻-type active layer 4 is, for example, $5.0 \times 10^{14}$ cm⁻³ to $5.0 \times 10^{16}$ cm⁻³. As the n-type impurities, for example, P (phosphorous) and As (arsenic) can be mentioned.

On the surface of the n⁻-type active layer 4, an element separation region 7 is formed that demarcates an outer peripheral region from a first element forming region 6 in which a semiconductor element is formed. In the present application, for the sake of convenience, the semiconductor element formed in the first element forming region 6 will be called an L-MOSSIT (Lateral-Metal Oxide Silicon Static Induction Transistor).

The element separation region 7 is formed so as to surround the periphery of the first element forming region 6. In the present preferred embodiment, description will be given of an element separation region 7 that is, in a plan view observed in the direction of a normal to the surface of the n⁻-type active layer 4 (hereinafter, simply referred to as a plan view), formed in a rectangular shape surrounding the periphery of the first element forming region 6 from all around as an example of the element separation region.

Referring to FIGS. 3A to 3C, the element separation region 7 is, in a sectional view, formed as a double trench structure including two element separating trenches 18 formed at an interval from each other.

The two element separating trenches 18 are formed dug down so that their respective bottom portions contact an upper portion of the BOX layer 3 from the surface of the n⁻-type active layer 4. On the surface of the n⁻-type active layer 4 in the element separation region 7 including side surfaces and bottom portions of the element separating trenches 18, an element separating insulating film 20 is formed. The element separating insulating film 20 is, for example, a silicon oxide film formed by oxidizing the surface of the n⁻-type active layer 4. In addition, the film thickness of the element separating insulating film 20 is, for example, a few nm to 100 nm, but can be appropriately changed according to the specification of the semiconductor device 1.

The element separating trench 18 is filled with a polysilicon electrode 21 doped with p-type impurities via the element separating insulating film 20. The impurity concentration of the polysilicon electrode 21 is, for example, $1.0 \times 10^{19}$ cm⁻³ to $5.0 \times 10^{20}$ cm⁻³.

The first element forming region 6 includes pluralities of n⁺-type source regions 8 and n⁺-type drain regions 9 formed transversally spaced apart in the surface of the n⁻-type active layer 4 and a gate trench group 10 composed of a plurality of gate trenches 11 each formed so as to extend across the n⁺-type source region 8 and the n⁺-type drain region 9 and arrayed at an interval from each other.

Referring to FIG. 1 and FIG. 2, the n⁺-type source regions 8 and the n⁺-type drain regions 9 are formed in a stripe shape in a plan view, and are alternately arrayed at an interval from each other. Also, the n⁺-type source regions 8 and the n⁺-type drain regions 9 are formed so that one-side ends and the other-side ends in their longitudinal direction are all located at positions spaced at a constant distance from the element separation region 7.

Also, referring to FIG. 3A and FIG. 3B, the n⁺-type source regions 8 and the n⁺-type drain regions 9 are formed at the same depth in the surface of the n⁻-type active layer 4. Respective bottom portions of the n⁺-type source regions 8 and the n⁺-type drain regions 9 are formed, for example, at positions of 0.2 μm to 1.0 μm from the surface of the n⁻-type active layer 4. The n⁺-type source regions 8 and the n⁺-type drain regions 9 are formed at the same concentration, and their impurity concentration is, for example, $1.0 \times 10^{19}$ cm⁻³ to $1.0 \times 10^{21}$ cm⁻³.

Referring to FIG. 1 and FIG. 2, similar to the n⁺-type source regions 8 and the n⁺-type drain regions 9, the gate trench groups 10 are arrayed in a stripe shape in a plan view, and are formed transversally spaced apart in the surface of the n⁻-type active layer 4. That is, the gate trench groups 10 are respectively formed in regions between the n⁺-type source regions 8 and the n⁺-type drain regions 9 alternately arrayed at an interval from each other.

The gate trenches 11 in the gate trench group 10 are formed with the same width as the interval between the n⁺-type source region 8 and the n⁺-type drain region 9, and formed so as to be sandwiched in a pair of the n⁺-type source region 8 and the n⁺-type drain region 9. In other words, the n⁺-type source regions 8 and the n⁺-type drain regions 9 are formed so as to respectively contact end portions of the gate trenches 11, and are completely separated by the gate trenches 11.

Also, the gate trenches 11 are formed at positions extending across the respective end portions in the longitudinal direction of the n⁺-type source region 8 and the n⁺-type drain region 9. The n⁺-type source region 8 and the n⁺-type drain region 9 are thereby, also at said end portions, completely separated by the gate trenches 11.

Further, the gate trench group 10 includes a sub-trench 16 that is the same in shape as the gate trench 11 between the end portions of the n⁺-type source region 8 and the n⁺-type drain region 9 and the element separating trench 18. The sub-trench 16 does not extend directly across the n⁺-type source region 8 and the n⁺-type drain region 9, but is formed so as to prevent the n⁺-type source region 8 and the n⁺-type drain region 9 from conducting in a region between said end portions and the element separating trench 18.

Although FIG. 1 and FIG. 2 show an arrangement in which a single sub-trench 16 is formed as an example of the sub-trench, a plurality of sub-trenches may be formed. Thus, two, three, or more than three sub-trenches may be formed.

Referring to FIG. 3A and FIG. 3C, the respective gate trenches 11 are formed in a manner dug down in the depth direction from the surface of the n⁻-type active layer 4. Bottom portions of the respective gate trenches 11 are located at a depth to contact an upper portion of the BOX layer 3. That is, the gate trenches 11 are formed dug down up to a depth corresponding to the layer thickness (0.5 μm to 5.0 μm) of the n⁻-type active layer 4.

Also, the respective gate trenches 11 are formed with a constant interval therebetween along their depth direction. That is, any side surface of the respective gate trenches 11 is formed so as to be substantially perpendicular (have an angle of 90°) with respect to the surface of the n⁻-type active layer 4.

A gate insulating film 12 is formed so as to cover the side surfaces and bottom portions of the respective gate trenches 11 and the surface of the n⁻-type active layer 4 between the respective gate trenches 11. The gate insulating film 12 is formed further so as to be integrally continuous with the element separating insulating film 20 formed in the element separation region 7. The gate insulating film 12 is formed with the same material and the same film thickness as those of the element separating insulating film 20.

The gate trench 11 is filled with a gate electrode 13 via the gate insulating film 12. The gate electrode 13, for example, includes polysilicon doped with p-type impurities. The impurity concentration of the gate electrode 13 is the same as the impurity concentration of the polysilicon electrode 21.

In the region where the gate trench group 10 is formed, agate wiring 19 is formed in a manner extending across a plurality of gate electrodes 13. The gate wiring 19 is formed so as to be integrally continuous with the plurality of gate electrodes 13, and serves as a common wiring to the plurality of gate electrodes 13. The gate wiring 19 is formed further so as to cover the element separation region 7, and is integrally continuous with the polysilicon electrode 21 buried in the element separating trench 18. Moreover, on the gate wiring 19, a silicide film 14 is formed.

In a region of the gate trench group 10 sandwiched by adjacent gate trenches 11, an n$^-$-type channel region 15 made of the n$^-$-type active layer 4 and having a channel length along a direction extending from the n$^+$-type drain region 9 to the n$^+$-type source region 8 is formed. Referring to FIG. 3B, the gate wiring 19 is opposed to the n$^-$-type channel region 15 via the gate insulating film 12.

The respective gate trenches 11 are formed with an interval therebetween, that is, a thickness T of the n$^-$-type channel region 15 in a plan view, not more than two times the width of a depletion layer to be generated due to a built-in potential between the n$^-$-type channel region 15 and the gate electrode 13. The thickness of the n$^-$-type channel region 15, in the case of the present preferred embodiment, is 0.1 µm to 0.35 µm.

An interlayer insulating film 23 is formed so as to cover the element separation region 7 and the first element forming region 6. In the first element forming region 6, source contacts 24 and drain contacts 25 to electrically connect the n$^+$-type source regions 8 and the n$^+$-type drain regions 9 are formed respectively penetrating through the interlayer insulating film 23. The source contacts 24 and the drain contacts 25 are in ohmic contact with the n$^+$-type source regions 8 and the n$^+$-type drain regions 9, respectively.

Also, in the element separation region 7, gate contacts 26 to be electrically connected with the gate wiring 19 are formed at an upper portion of the gate wiring 19 penetrating through the interlayer insulating film 23. The gate contacts 26 are thereby connected to the gate electrodes 13 and the polysilicon electrodes 21 via the gate wiring 19.

Next, the operation of the semiconductor device 1 will be described in detail with reference to FIG. 4A, FIG. 4B, FIG. 5A and FIG. 5B.

Figure 4A:
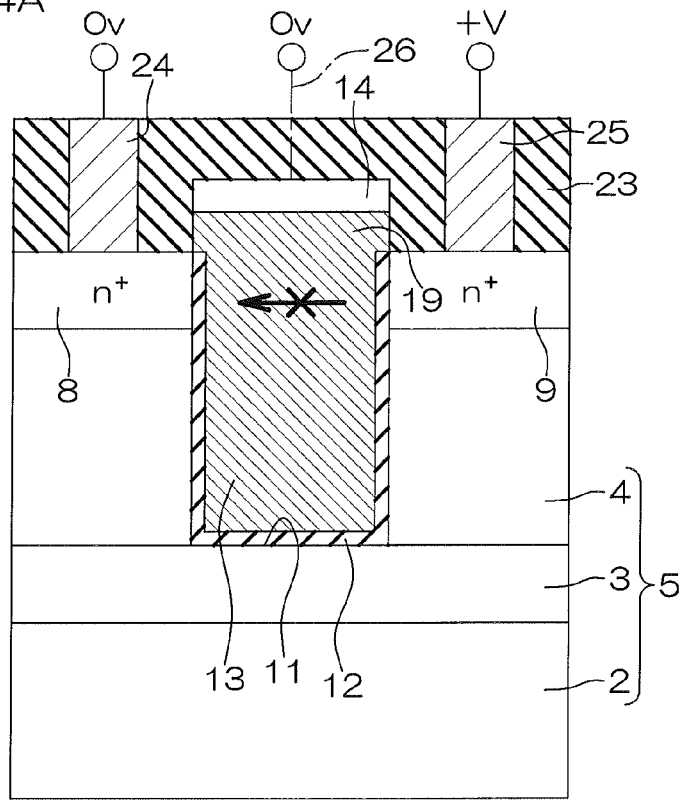
FIGS. 4A and 4B show schematic sectional views for explaining the operation when the semiconductor device is off.
Figure 4B:
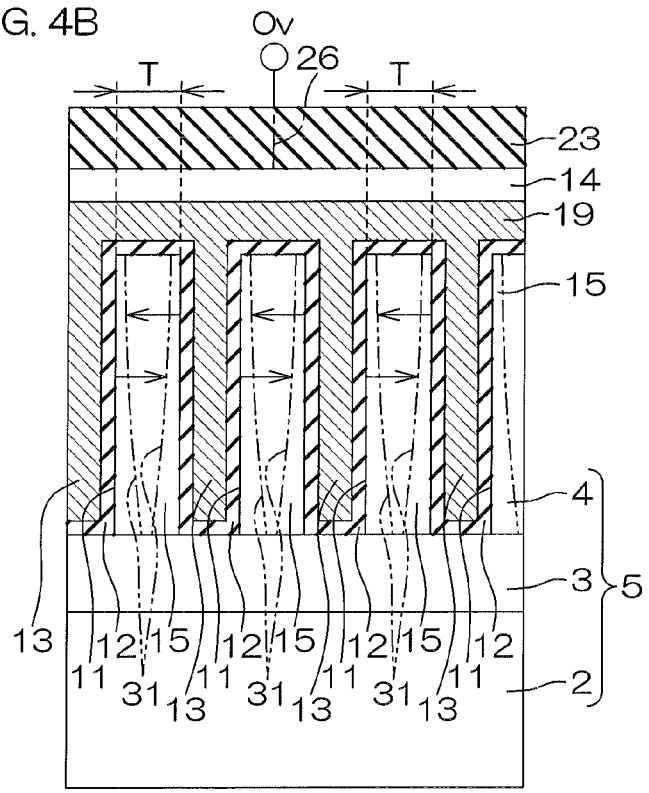
Figure 5A:
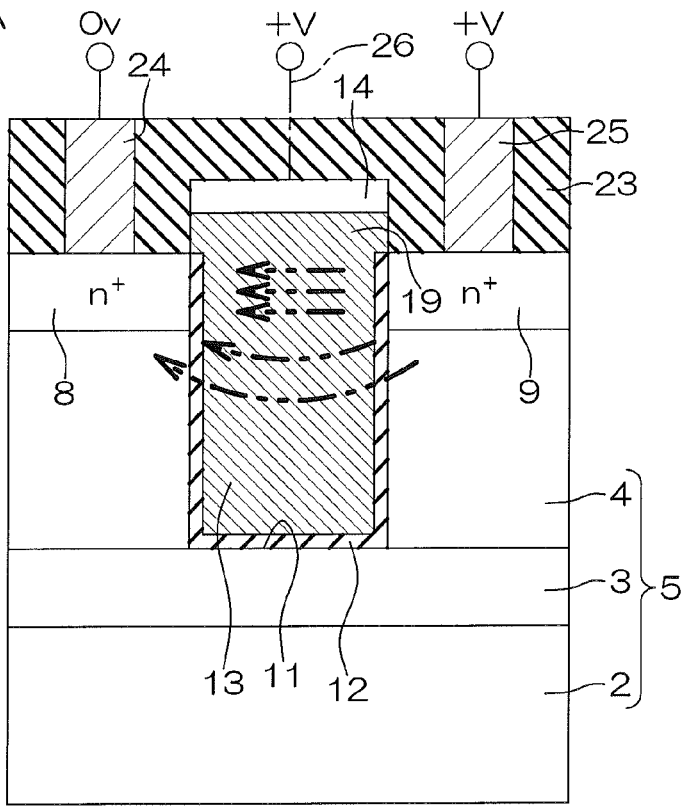
Figure 5B:
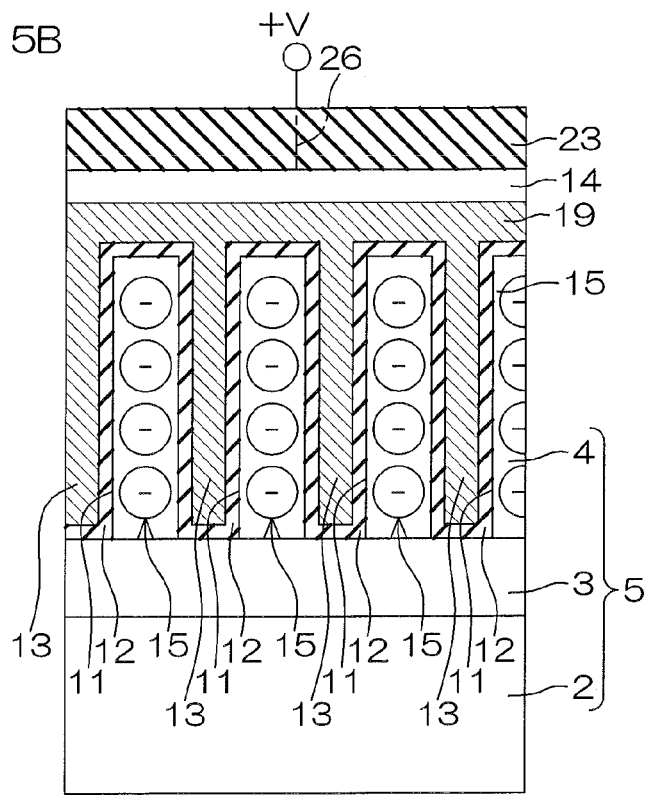

FIGS. 4A and 4B show sectional views for explaining the operation when the semiconductor device 1 is off. FIGS. 5A and 5B show sectional views for explaining the operation when the semiconductor device 1 is on. FIG. 4A and FIG. 5A are views of a part of the view of FIG. 3A enlarged, and FIG. 4B and FIG. 5B are views of a part of the view of FIG. 3C enlarged.

First, referring to FIGS. 4A and 4B, if a voltage to be applied to the source contact 24 is set to 0v and a voltage to be applied to the gate contact 26 is set to 0v (that is, the semiconductor device 1 is turned off), due to a built-in potential in the n$^-$-type channel region 15 and the gate electrode 13, depletion layers 31 are formed in a manner expanding toward the n$^-$-type channel region 15 (in the directions of arrows in FIG. 4B) from each of the adjacent gate electrodes 13.

The respective gate trenches 11 are formed with an interval therebetween, that is, a thickness T of the n$^-$-type channel region 15 in a plan view, not more than two times the width of the depletion layer 31 to be generated due to a built-in potential in the n$^-$-type channel region 15 and the gate electrode 13.

Thus, as a result of the depletion layers 31 expanding from the adjacent gate electrodes 13 overlapping each other in the n$^-$-type channel region 15, the n$^-$-type channel region 15 is fully depleted to be electrically disconnected. Thereby, even if a predetermined positive voltage (+v) is applied to the drain contact 25, current does not flow because the n$^-$-type channel region 15 is fully depleted.

On the other hand, as shown in FIG. 5A, when a predetermined positive voltage (+v) is applied to the gate contact 26 (that is, when the semiconductor device 1 is turned on), the depletion layer 31 formed in the n$^-$-type channel region 15 diminishes or disappears. Further, if the voltage to be applied to the gate contact 26 is increased, as shown in FIG. 5B, electrons included in the n$^-$-type active layer 4 are attracted to the n$^-$-type channel region 15, and an apparent n-type concentration in the n$^-$-type channel region 15 rises.

If a predetermined positive voltage (+v) is applied to the drain contact 25 at this time, current can easily pass through the n$^-$-type channel region 15 (n$^-$-type active layer 4) in which the depletion layers 31 have disappeared, so that current flows between the n$^+$-type source region 8 and the n$^+$-type drain region 9. Especially, in an upper region of the n$^-$-type active layer 4 sandwiched by the n$^+$-type source region 8 and the n$^+$-type drain region 9, linear electric lines of force are formed (refer to the straight lines shown by alternate long and two short dashed lines in FIG. 5B). The electric lines of force drawn in a large number mean that a large current flows.

On the other hand, in a lower region of the n$^-$-type active layer 4 not sandwiched by the n$^+$-type source region 8 and the n$^+$-type drain region 9, circular arc-shaped electric lines of force are formed (refer to the circular arc-shaped curves shown by alternate long and two short dashed lines in FIG. 5B). In said region, because the total number of electric lines of force is relatively small, current flows slightly less easily than in the upper region.

In addition, it is preferable that the gate trenches 11 are arrayed in dot shapes having a length corresponding to the channel length along a direction extending from the n$^+$-type drain region 9 to the n$^+$-type source region 8 and at equal intervals. Such an arrangement allows accurately adjusting the channel thickness in the respective n$^-$-type channel regions 15. Also, because current variation in the respective n$^-$-type channel regions 15 can be suppressed, a lower dynamic resistance value can be obtained.

As above, according to the arrangement of the semiconductor device 1, when the semiconductor device 1 is off (when a voltage is not applied to the gate electrodes 13), the n$^-$-type channel region 15 is fully depleted to be electrically disconnected, so that no current flows to the n$^-$-type channel region 15. That is, according to the arrangement of the semiconductor device 1, a normally-off semiconductor device can be provided.

On the other hand, when the semiconductor device 1 is on (when a voltage is applied to the gate electrodes 13), the depletion layers 31 can be made to diminish or disappear to make the n$^-$-type channel region 15 conduct. Furthermore, because a region made of the n$^-$-type active layer 4 can be used as the n$^-$-type channel region 15 without using an inversion layer for the channel as in the conventional MOSFET, the channel thickness can be made relatively thick. Also, carrier mobility degradation unique to an inversion layer can be suppressed. As a result, a semiconductor device having a low dynamic resistance value can be provided.

As semiconductor devices using a method not using an inversion layer, SITs (Static Induction Transistors) and junction FETs (Field-Effect Transistors) can be mentioned.

In these semiconductor devices, gate diffusion regions facing each other are formed in a semiconductor substrate and a voltage to the gate diffusion regions is controlled to thereby open and close a channel region made of a part of the semiconductor substrate formed between said regions by depletion layers. Therefore, the channel width can be wide, and also, because there is no carrier mobility degradation unique to an inversion layer, the electric resistance value of the channel can be reduced.

However, because the gate regions are formed by impurity diffusion, a planar pattern cannot help but be increased for performing formation in the depth direction to some extent. Thus, in the SITs and junction FETs, there is a problem that minute formation cannot be performed to result in considerably large-sized semiconductor elements. Further, there is also a fundamental problem that the SITs and junction FETs are semiconductor devices that are based on being normally on, in which a current flows even in a state where a voltage is not applied, and are therefore extremely poor in usability.

In contrast, according to the arrangement of the semiconductor device 1, unlike the SITs and junction FETs, because the gate electrode 13 is buried in the gate trench 11 via the gate insulating film 12, impurity diffusion is delimited by the gate insulating film 12.

Because the gate electrode 13 can thereby be formed in the depth direction from the surface of the $n^-$-type active layer 4, an increase in the planar pattern can be suppressed. As a result, because the semiconductor element can be miniaturized, a large channel width can be secured per unit area. Alternatively, the channel width can also be increased by deeply forming the gate trench 11.

In this manner, the multiple weaknesses of the SITs, junction FETs, and MOSFETs can be simultaneously solved in the semiconductor device 1. Furthermore, according to the arrangement of the semiconductor device 1, because of being a lateral semiconductor device that allows extremely easy mixed mounting as an LSI, a semiconductor device having an extremely high affinity with other semiconductor elements can be provided. In view of these points, in the present preferred embodiment, the semiconductor element formed in the first element forming region 6 is called an L-MOSSIT (Lateral-Metal Oxide Silicon Static Induction Transistor) for the sake of convenience.

Also, according to the arrangement of the semiconductor device 1, because the interval of the respective gate trenches 11 adjacent to each other is constant along their depth direction, the depletion layers 31 expanding from the respective gate trenches 11 adjacent to each other can be overlapped mutually and reliably in the $n^-$-type channel region 15. As a result, a satisfactory normally-off operation can be realized.

Also, according to the arrangement of the semiconductor device 1, the gate trench 11 is formed so as to reach the BOX layer 3 from the surface of the $n^-$-type active layer 4, and can therefore effectively suppress the $n^+$-type source region 8 and the $n^+$-type drain region 9 from conducting via a lower portion of the $n^-$-type active layer 4.

Next, a manufacturing process of the semiconductor device 1 will be described with reference to FIG. 6A to FIG. 6G.

FIG. 6A to FIG. 6G are sectional views for explaining an example of the manufacturing process of the semiconductor device 1. In addition, FIG. 6A to FIG. 6G respectively correspond to FIG. 3A.

Figure 6A:
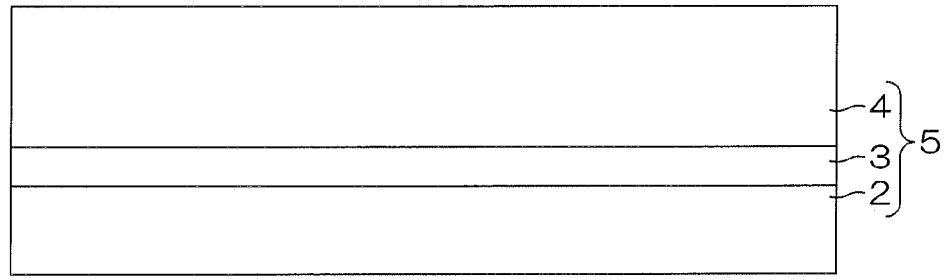
FIG. 6A to FIG. 6G are sectional views for explaining an example of a manufacturing process of the semiconductor device.

For manufacturing the semiconductor device 1, as shown in FIG. 6A, an SOI substrate 5 is prepared. The SOI substrate 5 can be obtained, for example, by forming a BOX layer 3 made of silicon oxide on the surface of a semiconductor substrate 2 being a p-type silicon substrate by applying a thermal oxidization processing thereto, and then forming an $n^-$-type active layer 4.

Figure 6B:
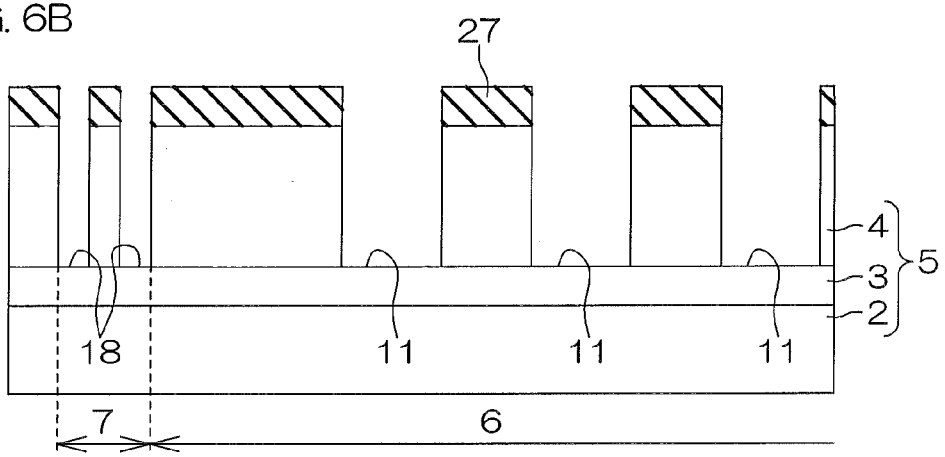

Next, as shown in FIG. 6B, a hard mask 27 selectively having openings in regions where the gate trenches 11 and the element separating trenches 18 need to be formed in the surface of the $n^-$-type active layer 4 is formed by a common method. Next, by applying an etching processing to the $n^-$-type active layer 4 via the hard mask 27, the gate trenches 11 and the element separating trenches 18 are formed, and the first element forming region 6 and the element separation region 7 are demarcated from each other.

In this case, the respective gate trenches 11 and the two element separating trenches 18 are formed so that the interval between the respective gate trenches 11 and the interval between the two element separating trenches 18 both become constant intervals along the depth direction from the surface of the $n^-$-type active layer 4. Also, respective bottom portions of the gate trenches 11 and the element separating trenches 18 are all formed up to a depth to reach an upper portion of the BOX layer 3. After the gate trenches 11 and the element separating trenches 18 are formed, the hard mask 27 is removed.

Figure 6C:
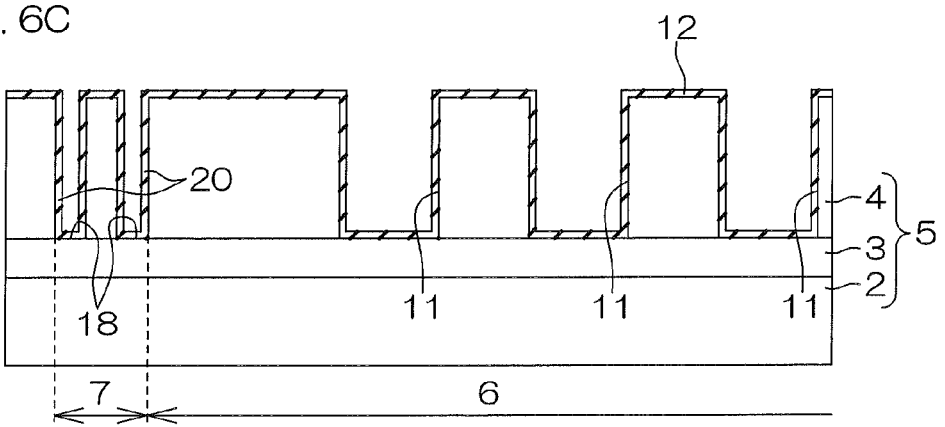

Next, as shown in FIG. 6C, as a result of a thermal oxidization processing being applied to the surface of the $n^-$-type active layer 4 including respective bottom portions and side surfaces of the gate trenches 11 and the element separating trenches 18, a gate insulating film 12 and an element separating insulating film 20 are integrally formed.

Figure 6D:
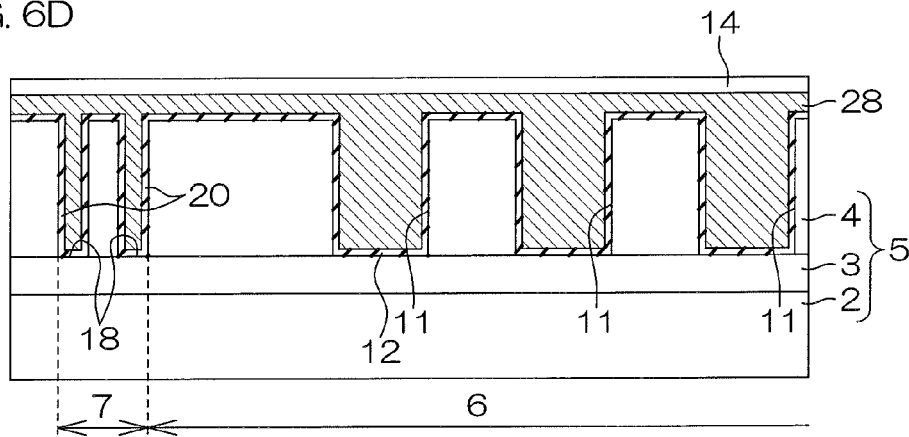

Next, as shown in FIG. 6D, a polysilicon layer 28 is formed so as to fill back the gate trenches 11 and the element separating trenches 18 and cover the surface of the $n^-$-type active layer 4. Next, into the polysilicon layer 28, p-type impurities are diffused so as to provide an opposite polarity to that of the $n^-$-type active layer 4. The diffusion of p-type impurities can be performed, for example, by doping p-type impurities at a dose amount on the order of $1.0 \times 10^{15}$ $cm^{-2}$ into the polysilicon layer 28 and then applying a thermal diffusion processing until the p-type impurities reach the bottom portions of the gate trenches 11 and the element separating trenches 18.

Next, on the polysilicon layer 28, for example, a silicide film 14 is formed by a sputtering method. By forming the silicide film 14, gate electrodes 13, polysilicon electrodes 21, and a gate wiring 19 that are to be formed later can be reduced in resistance value, and mixing of n-type impurities to be doped later in the gate electrodes 13, the polysilicon electrodes 21, and the gate wiring 19 can be prevented.

Figure 6E:
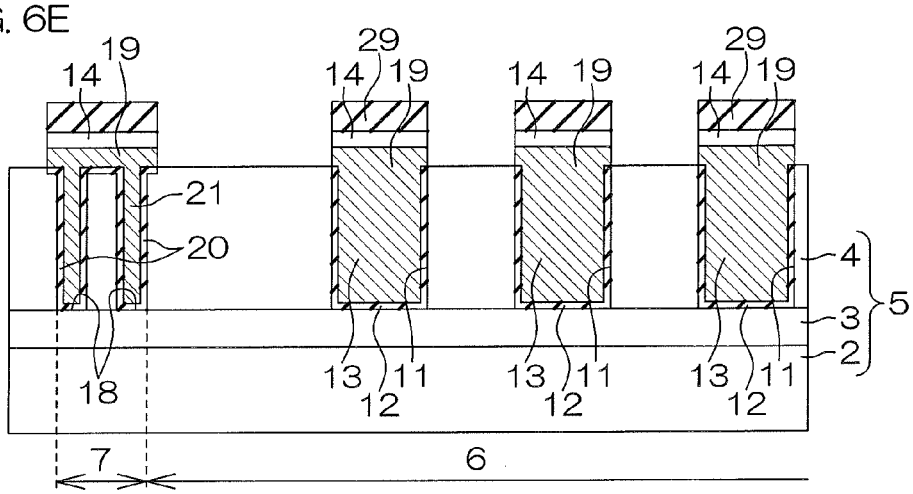

Next, as shown in FIG. 6E, a resist mask 29 to cover regions where the gate electrodes 13, the polysilicon electrodes 21, and the gate wiring 19 need to be formed is selectively formed on the silicide film 14. Then, an etching processing is applied via openings of the resist mask 29 to unnecessary parts of the silicide film 14 and the polysilicon layer 28 and the gate insulating film 12 and the element separating insulating film 20. The gate electrodes 13, the polysilicon electrodes 21, and the gate wiring 19 are thereby integrally formed. After the gate electrodes 13, the polysilicon electrodes 21, and the gate wiring 19 are formed, the resist mask 29 is removed.

Figure 6F:
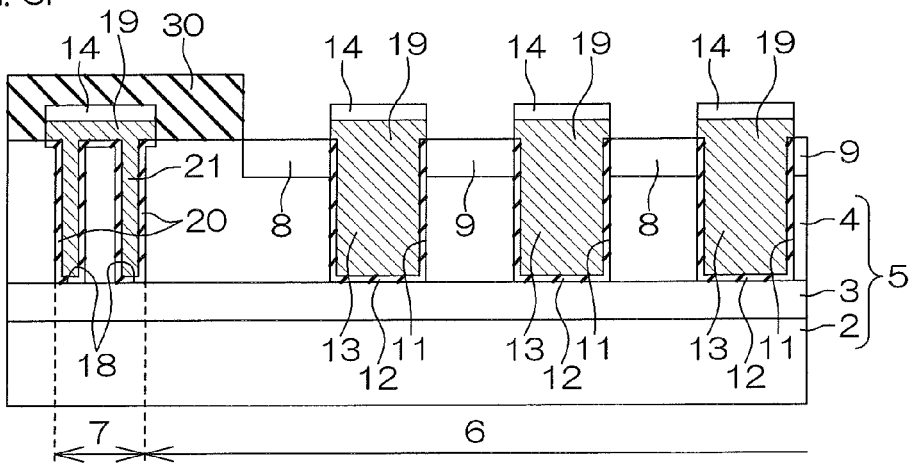

Next, as shown in FIG. 6F, an ion implantation mask 30 is formed so as to selectively cover a region other than regions where the n$^+$-type source regions 8 and the n$^+$-type drain regions 9 need to be formed. Then, n-type impurities are diffused via the ion implantation mask 30 and the silicide film 14. The diffusion of n-type impurities can be performed, for example, by doping n-type impurities at a dose amount on the order of $1.0 \times 10^{15}$ cm$^{-2}$ into parts where the n$^-$-type active layer 4 is exposed and then applying a thermal diffusion processing. The n$^+$-type source regions 8 and the n$^+$-type drain regions 9 are thereby formed. The ion implantation mask 30 is removed before applying the thermal diffusion processing.

Figure 6G:
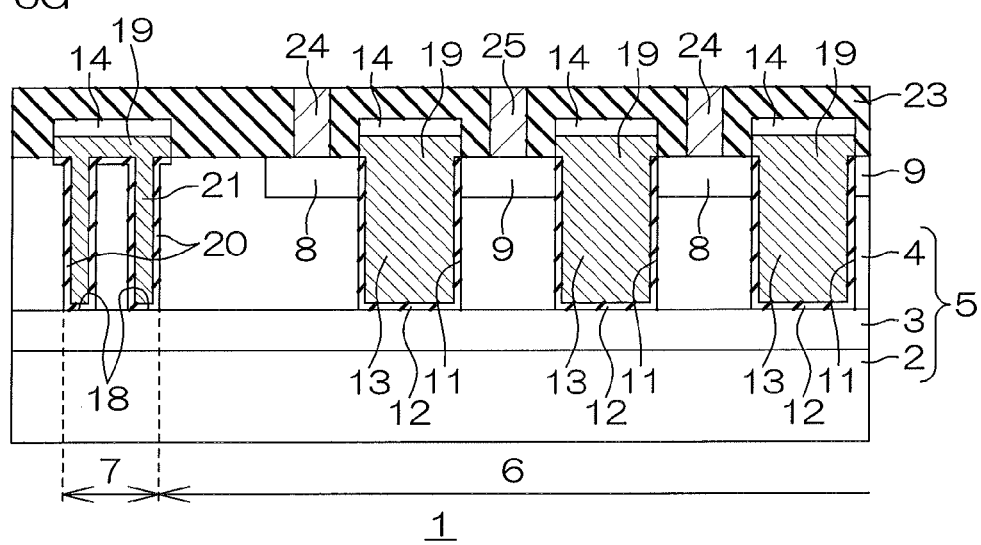

Next, as shown in FIG. 6G, an interlayer insulating film 23 is formed so as to cover the first element forming region 6 and the element separation region 7. Next, in the first element forming region 6, source contacts 24 and drain contacts 25 to connect the n$^+$-type source regions 8 and the n$^+$-type drain regions 9 are formed and gate contacts 26 to connect the gate electrodes 13 and the polysilicon electrodes 21 are formed in the element separation region 7, respectively penetrating through the interlayer insulating film 23. In addition, after the source contacts 24, the drain contacts 25, and the gate contacts 26 are formed, the respective contacts 24, 25, and 26 are connected to wiring (not shown). Through the above process, the semiconductor device 1 according to the first preferred embodiment of the present invention is manufactured.

Next, a second preferred embodiment of the present invention will be described with reference to FIG. 7 and FIG. 8.

Figure 7:
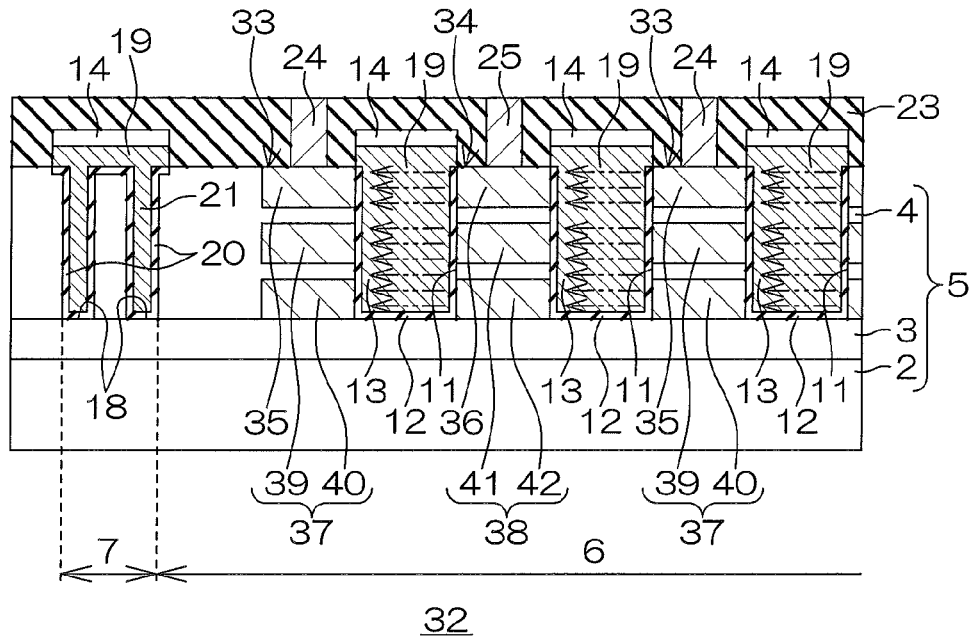
FIG. 7 is a schematic sectional view of a semiconductor device according to a second preferred embodiment of the present invention.
Figure 8:
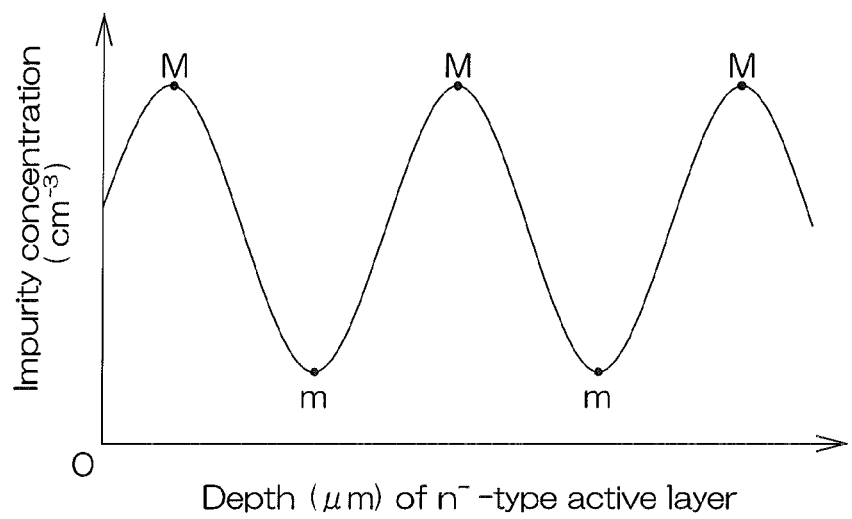
FIG. 8 is a graph showing the impurity concentration of a source region and drain region.

FIG. 7 is a schematic sectional view of a semiconductor device 32 according to the second preferred embodiment of the present invention. FIG. 8 is a graph showing the impurity concentration of an n$^+$-type source region 33 and an n$^+$-type drain region 34.

The difference in the semiconductor device 32 from the semiconductor device 1 according to the first preferred embodiment described above is that n$^+$-type source regions and n$^+$-type drain regions including a plurality of layers are formed. Other arrangements are equivalent to those of the semiconductor device 1. In FIG. 7, parts corresponding to the respective parts shown in FIG. 3A described above will be denoted by the same reference signs, and descriptions thereof will be omitted.

In addition, in the present preferred embodiment, description will be given of an n$^+$-type source region 33 and an n$^+$-type drain region 34 including three layers as an example of the n$^+$-type source region and n$^+$-type drain region including a plurality of layers.

The n$^+$-type source region 33 includes an n$^+$-type source surface layer 35 formed at the surface of the n$^-$-type active layer 4 and an n$^+$-type source buried layer 37 consisting of a plurality of layers (in the present preferred embodiment, two layers) formed in the n$^-$-type active layer 4 lower than the n$^+$-type source surface layer 35. Specifically, the n$^+$-type source buried layer 37 includes an n$^+$-type source deepest layer 40 formed so that its bottom portion contacts an upper portion of the BOX layer 2 and an n$^+$-type source intermediate layer 39 formed between the n$^+$-type source surface layer 35 and the n$^+$-type source deepest layer 40.

Also, the n$^+$-type drain region 34 similarly includes an n$^+$-type drain surface layer 36 formed at the surface of the n$^-$-type active layer 4 and an n$^+$-type drain buried layer 38 consisting of a plurality of layers (in the present preferred embodiment, two layers) formed in the n$^-$-type active layer 4 lower than the n$^+$-type drain surface layer 36. Specifically, the n$^+$-type drain buried layer 38 includes an n$^+$-type drain deepest layer 42 formed so that its bottom portion contacts an upper portion of the BOX layer 2 and an n$^+$-type drain intermediate layer 41 formed between the n$^+$-type drain surface layer 36 and the n$^+$-type drain deepest layer 42.

In addition, FIG. 7 shows, as an example of the disposition of the n$^+$-type source surface layer 35 and the n$^+$-type drain surface layer 36 and the n$^+$-type source buried layer 37 and the n$^+$-type drain buried layer 38, an arrangement in which the respective layers are formed at an interval from each other.

Next, the impurity concentration of the n$^+$-type source region 33 and the n$^+$-type drain region 34 will be described with reference to FIG. 8. According to FIG. 8, the impurity concentration in the n$^+$-type source region 33 and the n$^+$-type drain region 34 changes so as to have three maximum values M and two minimum values m in the depth direction from the surface of the n$^-$-type active layer 4.

Regions including the three maximum values M correspond to the regions in which the n$^+$-type source surface layer 35 and the n$^+$-type source buried layer 37 and the n$^+$-type drain surface layer 36 and the n$^+$-type drain buried layer 38 are formed. Also, regions including the two minimum values m correspond to a region between the respective layers in the n$^+$-type source surface layer 35 and the n$^+$-type source buried layer 37 and a region between the respective layers in the n$^+$-type drain surface layer 36 and the n$^+$-type drain buried layer 38.

The impurity concentration at the three maximum values is, for example, $1.0 \times 10^{19}$ cm$^{-3}$ to $1.0 \times 10^{21}$ cm$^{-3}$. In addition, the n$^+$-type source surface layer 35 and the n$^+$-type source buried layer 37 and the n$^+$-type drain surface layer 36 and the n$^+$-type drain buried layer 38 may continue thinly in the regions between the respective layers.

Figure 9:
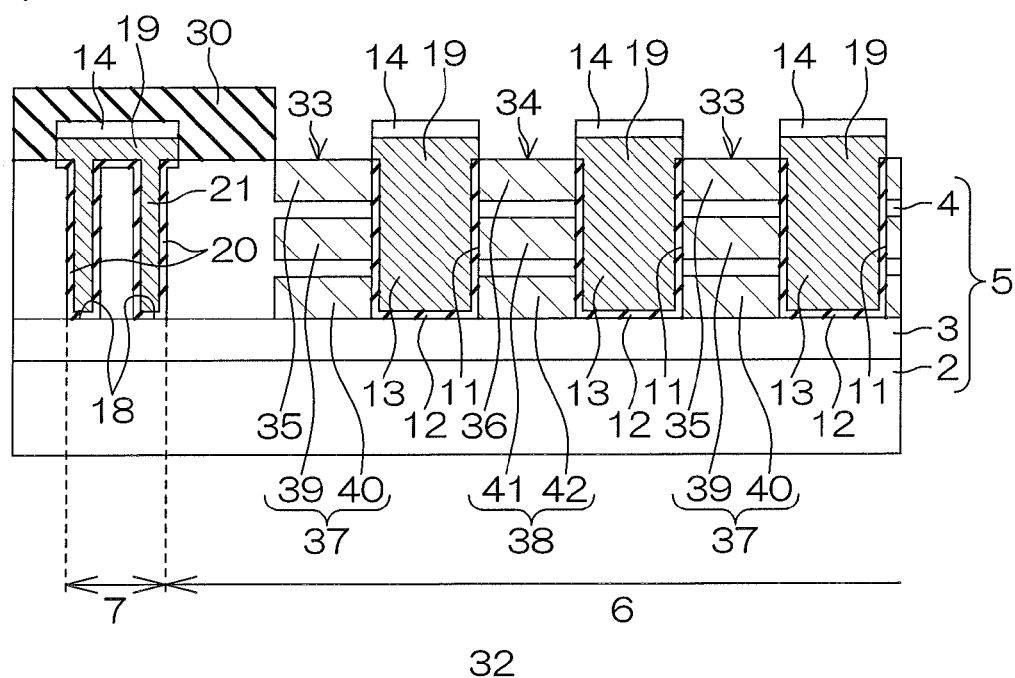
FIG. 9 is a sectional view for explaining an example of a manufacturing process of the semiconductor device of FIG. 7.

Next, a manufacturing process of the semiconductor device 32 will be described with reference to FIG. 9. FIG. 9 is a sectional view for explaining an example of the manufacturing process of the semiconductor device 32 of FIG. 7.

The difference in the manufacturing process of the semiconductor device 32 from the manufacturing process of the semiconductor device 1 according to the first preferred embodiment described above is that the step of FIG. 9 is performed after the step of FIG. 6E. Because the steps from FIG. 6A to FIG. 6E are the same as those in the manufacturing process of the semiconductor device 1, a description thereof will be omitted.

In the manufacturing process of the semiconductor device 32, similar to the step of FIG. 6F, an ion implantation mask 30 is formed, as shown in FIG. 9. Then, n-type impurities are selectively doped in the depth direction of the n$^-$-type active layer 4 by a high-voltage ion implantation method via the ion implantation mask 30.

The doping energy when forming the n$^+$-type source surface layer 35 and the n$^+$-type drain surface layer 36 is, for example, 30 keV to 70 keV. Also, the doping energy when forming the n$^+$-type source intermediate layer 39 and the n$^+$-type drain intermediate layer 41 is, for example, 150 keV to 600 keV. Also, the doping energy when forming the n$^+$-type source deepest layer 40 and the n$^+$-type drain deepest layer 42 is, for example, 300 keV to 1300 keV.

Next, a thermal diffusion processing is applied to the n$^-$-type active layer 4. The n-type impurities doped into the n$^-$-type active layer 4 are thereby diffused, and the n$^+$-type source surface layer 35 and the n⁺-type drain surface layer 36 and the n⁺-type source buried layer 37 and the n⁺-type drain buried layer 38 having the impurity concentration as in FIG. 8 are formed. In addition, the ion implantation mask 30 is removed before applying the thermal diffusion processing. Then, the semiconductor device 32 is formed through the same step as FIG. 6G.

As above, according to the arrangement of the semiconductor device 32, the n⁺-type source region 33 and the n⁺-type drain region 34 including three layers are respectively formed, by a high-voltage ion implantation method, thoroughly in the depth direction from the surface of the n⁻-type active layer 4. At this time, electric lines of force in the respective layers 35, 39, and 40 of the n⁺-type source region 33 and electric lines of force in the respective layers 36, 41, and 42 of the n⁺-type drain region 34 are distributed almost uniformly thoroughly in the depth direction from the surface of the n⁻-type active layer 4.

That is, in respective regions of the n⁻-type active layer 4 sandwiched by the respective layers of the n⁺-type source region 33 and the n⁺-type drain region 34, linear electric lines of force are formed (refer to the straight lines shown by alternate long and two short dashed lines in FIG. 7). There are relatively many electric lines of force drawn thoroughly in the depth direction from the surface of the n⁻-type active layer 4, and which means that a current can be caused to flow relatively satisfactorily.

Furthermore, because the respective electric lines of force are distributed almost uniformly thoroughly in the depth direction from the surface of the n⁻-type active layer 4, variation in current in the n⁺-type source region 33 and the n⁺-type drain region 34 can be effectively suppressed. As a result, a semiconductor device that can effectively suppress an increase in dynamic resistance value can be provided.

Next, a third preferred embodiment of the present invention will be described with reference to FIG. 10 and FIG. 11.

Figure 10:
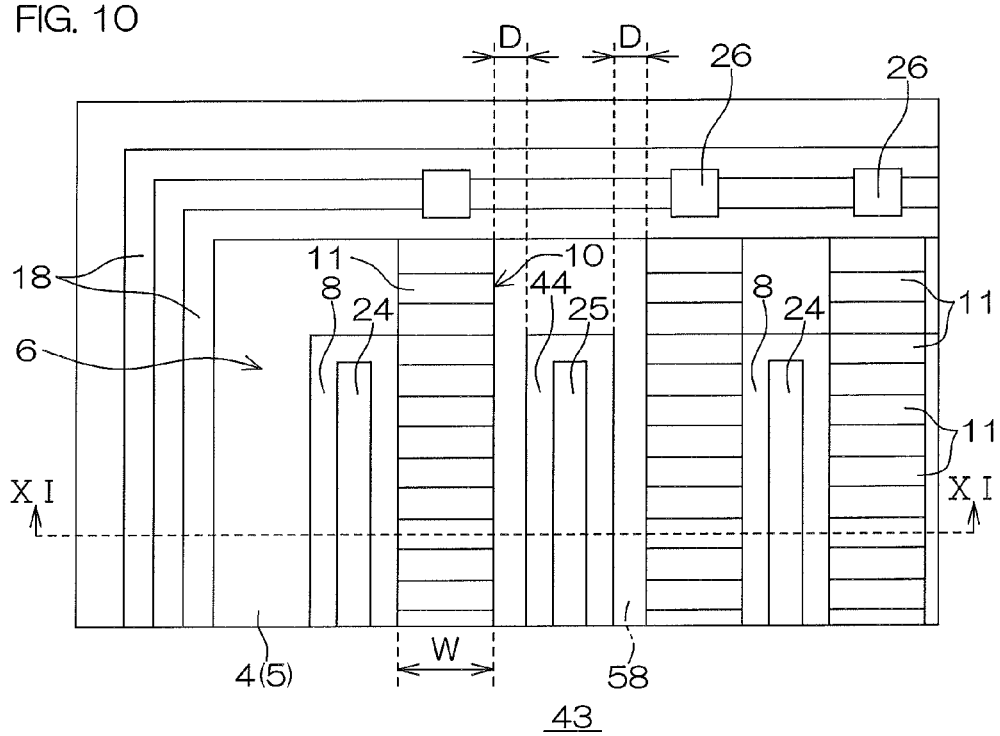
FIG. 10 is an enlarged schematic plan view of a semiconductor device according to a third preferred embodiment of the present invention.
Figure 11:
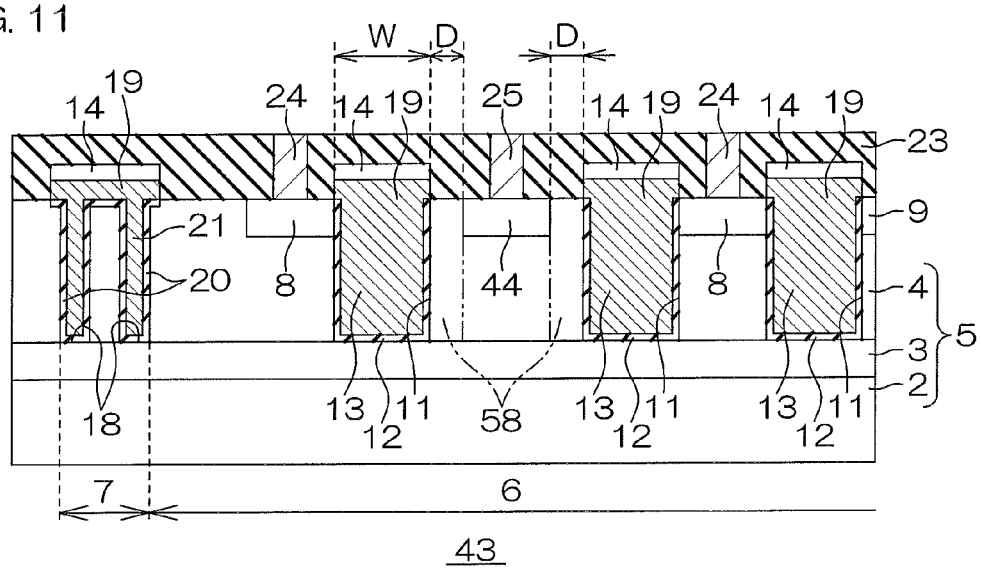
FIG. 11 is a sectional view taken along a section line XI-XI in FIG. 10.

FIG. 10 is an enlarged schematic plan view of a semiconductor device 43 according to the third preferred embodiment of the present invention. FIG. 11 is a sectional view taken along a section line XI-XI in FIG. 10.

The difference in the semiconductor device 43 from the semiconductor device 1 according to the first preferred embodiment described above is that n⁺-type drain regions 44 are formed in place of the n⁺-type drain regions 9. Other arrangements are equivalent to those of the semiconductor device 1. In FIG. 10 and FIG. 11, parts corresponding to the respective parts shown in FIG. 2 and FIG. 3A described above will be denoted by the same reference signs, and descriptions thereof will be omitted.

In the semiconductor device 43, the n⁺-type drain regions 44 are formed so as to be spaced at a predetermined interval with end portions of the gate trench groups 10. That is, a withstand voltage maintaining region 58 made of the n⁻-type active layer 4 is interposed across the gate trenches 11 between the n⁺-type drain region 44 and the gate trench group 10. The distance between a side surface of the n⁺-type drain region 44 and the end portion of the gate trench group 10, that is, the thickness D of the withstand voltage maintaining region 58 is, for example, 0.5 μm to 100 μm.

In the semiconductor device 1 of the first preferred embodiment described above, there is no space for a depletion layer expanding when a voltage is applied to the n⁺-type drain region 9, so that a drain-gate withstand voltage is limited at the withstand voltage of the gate insulating film 12, but in the semiconductor device 43 of the third preferred embodiment, because the depletion layer can expand toward the withstand voltage maintaining region 5, a drain-gate withstand voltage of the element can be significantly improved.

Next, a fourth preferred embodiment of the present invention will be described with reference to FIG. 12 and FIG. 13.

Figure 12:
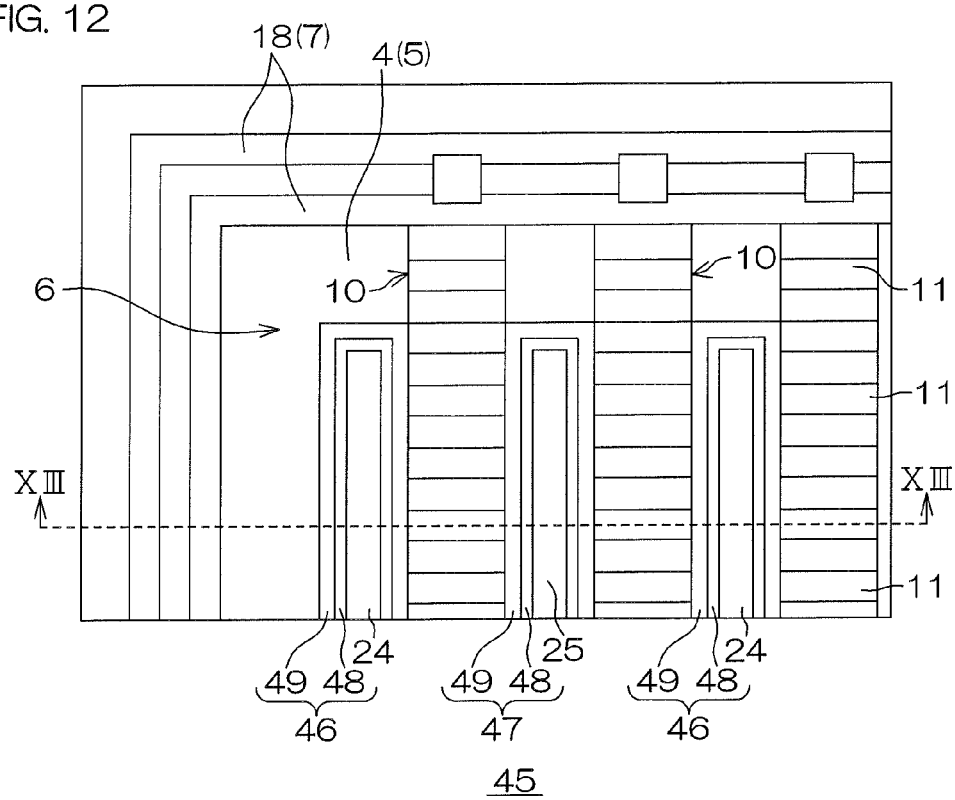
FIG. 12 is an enlarged schematic plan view of a semiconductor device according to a fourth preferred embodiment of the present invention.
Figure 13:
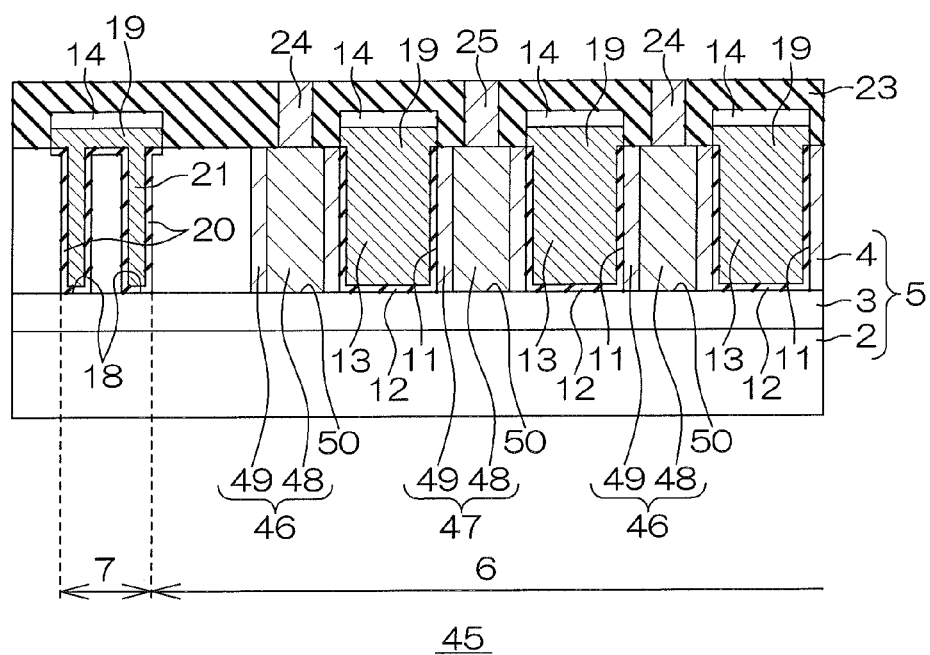
FIG. 13 is a sectional view taken along a section line XIII-XIII in FIG. 12.

FIG. 12 is an enlarged schematic plan view of a semiconductor device 45 according to the fourth preferred embodiment of the present invention. FIG. 13 is a sectional view taken along a section line XIII-XIII in FIG. 12.

The difference in the semiconductor device 45 from the semiconductor device 1 according to the first preferred embodiment described above is that n⁺-type source regions 46 and n⁺-type drain regions 47 are formed in place of the n⁺-type source regions 8 and the n⁺-type drain regions 9. Other arrangements are equivalent to those of the semiconductor device 1. In FIG. 12 and FIG. 13, parts corresponding to the respective parts shown in FIG. 2 and FIG. 3A described above will be denoted by the same reference signs, and descriptions thereof will be omitted.

Similar to the n⁺-type source regions 8 and the n⁺-type drain regions 9 in the semiconductor device 1 described above, the n⁺-type source regions 46 and the n⁺-type drain regions 47 in the semiconductor device 45 are formed in a stripe shape in a plan view observed in the direction of a normal to the surface of the n⁻-type active layer 4, and are alternately arrayed at an interval from each other.

The n⁺-type source regions 46 and the n⁺-type drain regions 47 both include high concentration regions having a relatively high concentration formed in the depth direction from the surface of the n⁻-type active layer 4 and low concentration regions formed so that the concentration continuously weakens in a direction perpendicular to said depth direction from the high concentration region.

In the present preferred embodiment, description will be given of an n⁺-type source region 46 and the n⁺-type drain region 47 each including a high concentration region 48 and a low concentration region 49 formed at a peripheral edge portion of the high concentration region 48 as an example of the high concentration region and low concentration region.

The n⁺-type source regions 46 and the n⁺-type drain regions 47 both include high concentration regions 48 having a relatively high concentration formed in a stripe shape in central portions of the n⁺-type source regions 46 and the n⁺-type drain regions 47 and low concentration regions 49 having a lower concentration than that of the high concentration regions 48 formed so as to surround the periphery of the high concentration regions 48.

The high concentration regions 48 of the n⁺-type source regions 46 and the n⁺-type drain regions 47 are formed by filling stripe-shaped high-concentration region trenches 50 formed by digging down into the surface of the n⁻-type active layer with polysilicon doped with n-type impurities. Bottom portions of the high-concentration region trenches 50 are formed so as to contact an upper portion of the BOX layer 3. The impurity concentration of the high concentration regions 48 is, for example, $1.0 \times 10^{19}$ cm⁻³ to $1.0 \times 10^{21}$ cm⁻³.

On the other hand, the low concentration regions 49 of the n⁺-type source regions 46 and the n⁺-type drain regions 47 are formed by diffusion into the n⁻-type active layer 4 of the n-type impurities doped into the polysilicon of the high concentration regions 48. In addition, bottom portions of the high concentration regions 48 and bottom portions of the low concentration regions 49 are both formed so as to contact an upper portion of the BOX layer 3.

Side surfaces of the gate trench groups 10 in the semiconductor device 45 are formed so as to contact the low concentration regions 49 of the n$^+$-type source region 46 and the n$^+$-type drain region 47. That is, end portions of the respective gate trenches 11 formed in the gate trench group 10 are formed so as to contact the low concentration regions 49 of the n$^+$-type source region 46 and the n$^+$-type drain region 47.

Next, a manufacturing process of the semiconductor device 45 will be described with reference to FIG. 14A to FIG. 14J. FIG. 14A to FIG. 14J are sectional views for explaining an example of the manufacturing process of the semiconductor device 45 of FIG. 12.

Figure 14A:
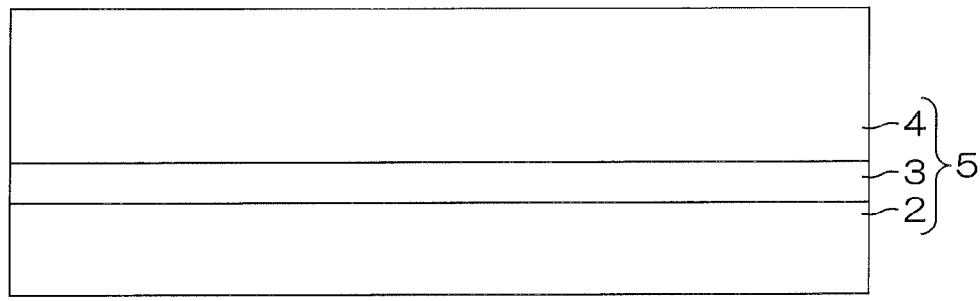
FIG. 14A to FIG. 14J are sectional views for explaining an example of a manufacturing process of the semiconductor device of FIG. 12.

For manufacturing the semiconductor device 45, similar to the first preferred embodiment described above, an SOI substrate 5 is prepared, as shown in FIG. 14A.

Figure 14B:
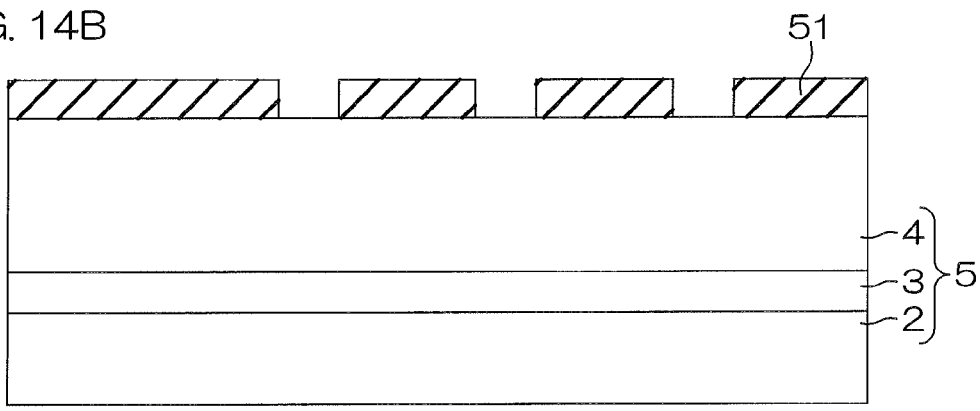
Figure 14C:
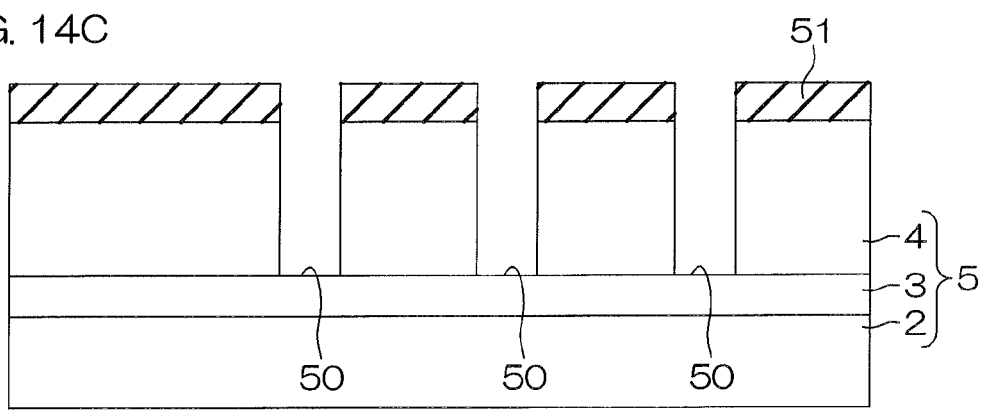

Next, as shown in FIG. 14B, a hard mask 51 selectively having openings in regions where the high concentration regions 48 of the n$^+$-type source regions 46 and the n$^+$-type drain regions 47 need to be formed is formed. Next, as a result of an etching processing being applied to the n$^-$-type active layer 4 via the hard mask 51, the high-concentration region trenches 50 are formed, as shown in FIG. 14C. After the high-concentration region trenches 50 are formed, the hard mask 51 is removed.

Figure 14D:
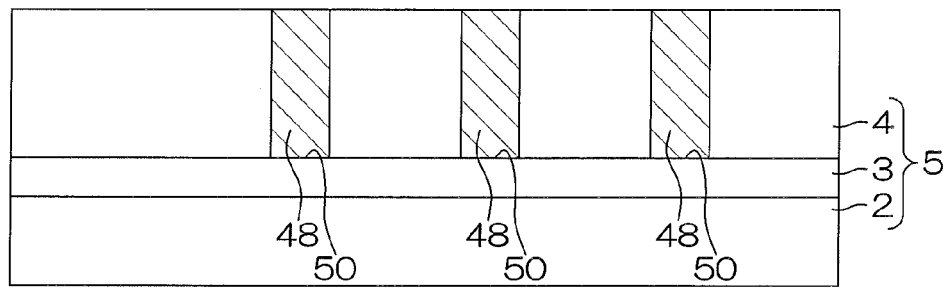

Next, as shown in FIG. 14D, polysilicon added with n-type impurities is deposited so as to fill back the high-concentration region trenches 50 and cover the surface of the n$^-$-type active layer 4. The deposition of polysilicon can be performed by a CVD method. Next, etching-back is applied to unnecessary polysilicon so that the polysilicon buried in the high-concentration region trenches 50 becomes substantially flush with the surface of the n$^-$-type active layer 4. The high concentration regions 48 of the n$^+$-type source regions 46 and the n$^+$-type drain regions 47 are thereby formed.

Figure 14E:
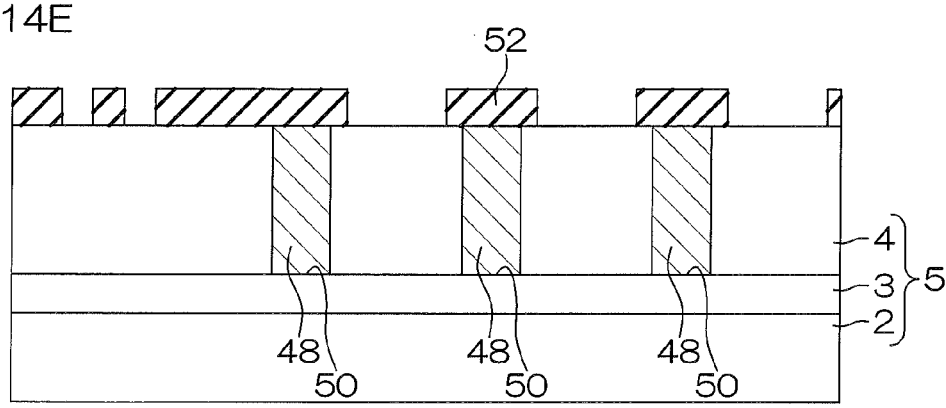

Next, as shown in FIG. 14E, a hard mask 52 selectively having openings in regions where the gate trenches 11 and the two element separating trenches 18 need to be formed in the surface of the n$^-$-type active layer 4 is formed.

Figure 14F:
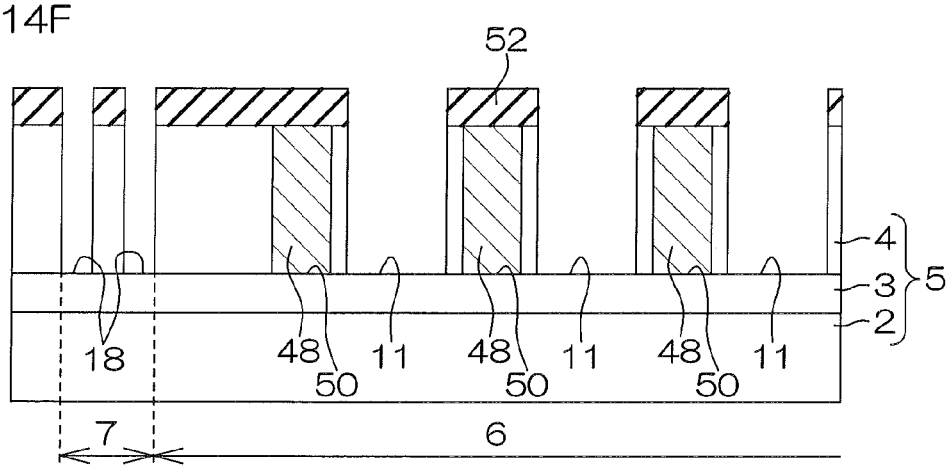

Next, as shown in FIG. 14F, by applying an etching processing to the n$^-$-type active layer 4 via the hard mask 52, the gate trenches 11 and the element separating trenches 18 are formed. In this case, the respective gate trenches 11 and the two element separating trenches 18 are formed so that the interval between the respective gate trenches 11 and the interval between the two element separating trenches 18 both become constant intervals along the depth direction from the surface of the n$^-$-type active layer 4. Also, bottom portions of the gate trenches 11 and the element separating trenches 18 are all formed up to a depth to reach an upper portion of the BOX layer 3. After the gate trenches 11 and the element separating trenches 18 are formed, the hard mask 52 is removed.

Figure 14G:
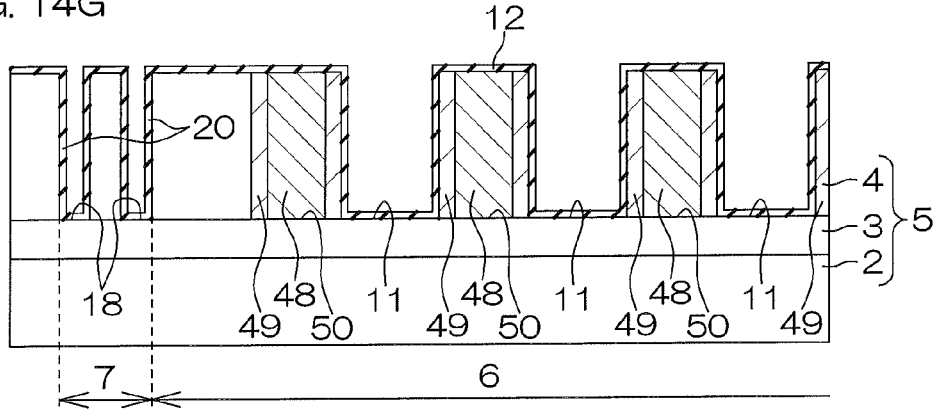

Next, as shown in FIG. 14G, as a result of a thermal oxidization processing being applied to the surface of the n$^-$-type active layer 4 including respective bottom surfaces and side surfaces of the gate trenches 11 and the element separating trenches 18, a gate insulating film 12 and an element separating insulating film 20 are integrally formed.

At this time, as a result of the n-type impurities doped into the polysilicon buried in the high-concentration region trenches 50 being diffused into the n$^-$-type active layer 4, low concentration regions 49 of the n$^+$-type source regions 46 and the n$^+$-type drain regions 47 are formed. The low concentration regions 49 of the n$^+$-type source regions 46 and the n$^+$-type drain regions 47 are formed so as to be exposed to the side surfaces of the gate trenches 11.

Figure 14H:
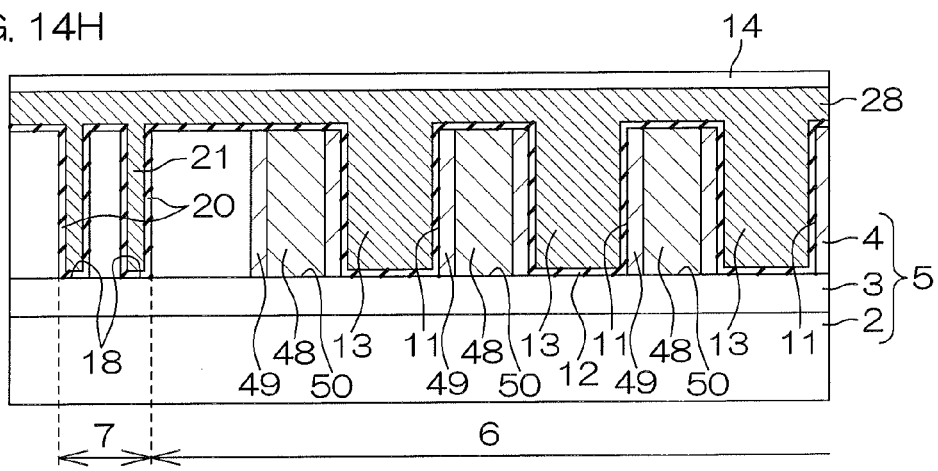
Figure 14:
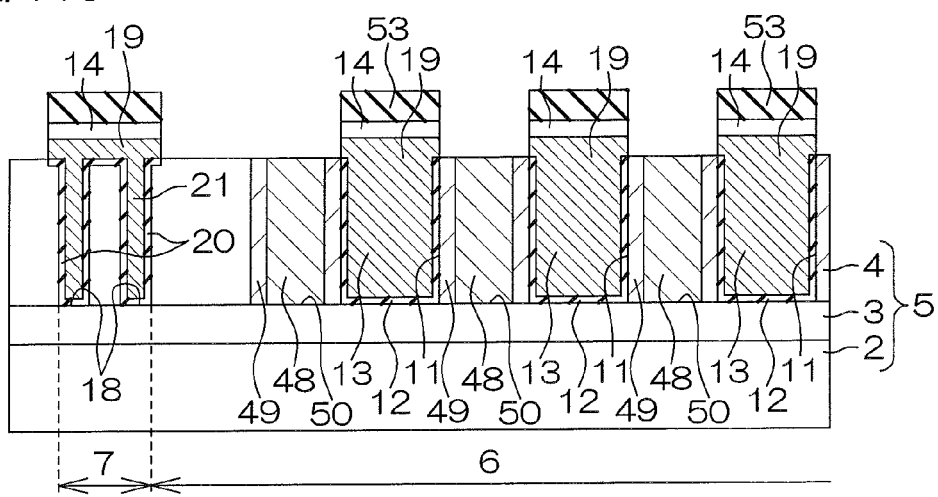

Next, as shown in FIG. 14H, a polysilicon layer 28 is formed so as to fill back the gate trenches 11 and the element separating trenches 18 and cover the surface of the n$^-$-type active layer 4. Next, into the polysilicon layer 28, p-type impurities are diffused so as to provide an opposite polarity to that of the n$^-$-type active layer 4. The diffusion of p-type impurities can be performed, for example, by doping p-type impurities at a dose amount on the order of $1.0 \times 10^{15}$ cm$^{-2}$ by an ion implantation method and then applying a thermal diffusion processing until the p-type impurities reach the bottom portions of the gate trenches 11 and the element separating trenches 18.

Next, on the polysilicon layer 28, for example, a silicide film 14 is formed by a sputtering method. By forming the silicide film 14, gate electrodes 13, polysilicon electrodes 21, and a gate wiring 19 that are to be formed later can be reduced in resistance value, and mixing of n-type impurities to be doped later in the gate electrodes 13, the polysilicon electrodes 21, and the gate wiring 19 can be prevented.

Next, as shown in FIG. 14I, a resist mask 53 having openings to selectively cover regions where the gate electrodes 13, the polysilicon electrodes 21, and the gate wiring 19 need to be formed is selectively formed on the silicide film 14. Then, an etching processing is applied via said openings to unnecessary parts of the silicide film 14 and the polysilicon layer 28 and the gate insulating film 12 and the element separating insulating film 20. The gate electrodes 13, the polysilicon electrodes 21, and the gate wiring 19 are thereby integrally formed. After the gate electrodes 13, the polysilicon electrodes 21, and the gate wiring 19 are formed, the resist mask 53 is removed.

Figure 14J:
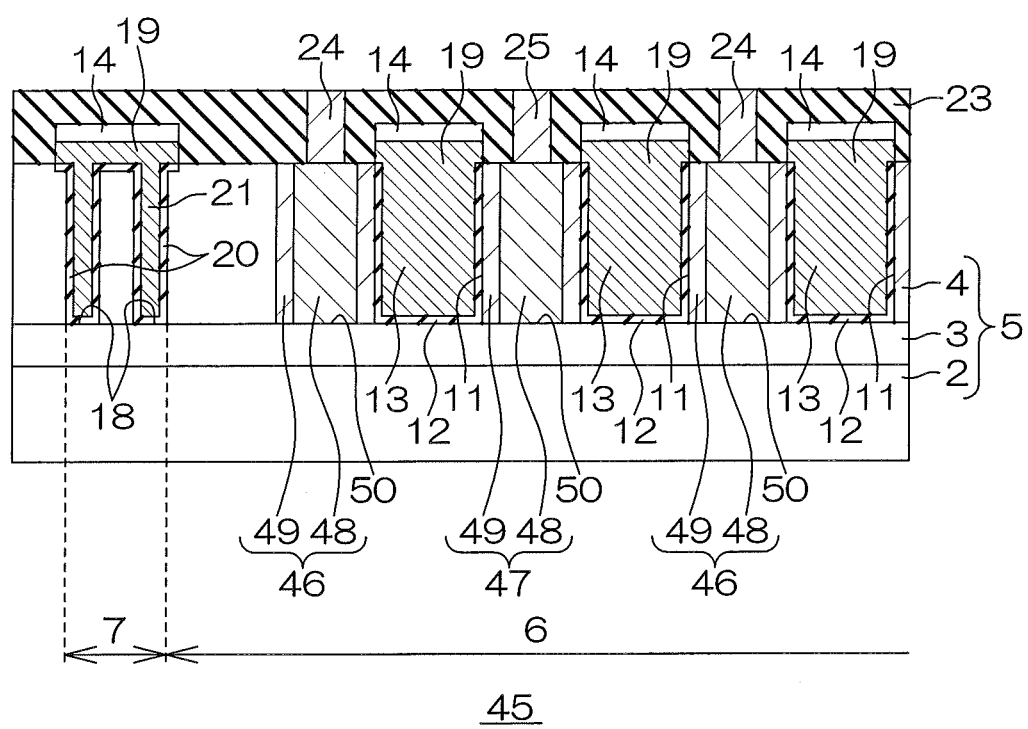

Next, as shown in FIG. 14J, an interlayer insulating film 23 is formed so as to cover the first element forming region 6 and the element separation region 7. Next, source contacts 24 and drain contacts 25 to connect the n$^+$-type source regions 46 and the n$^+$-type drain regions 47 are formed in the first element forming region 6 and gate contacts 26 to connect the gate electrodes 13 and the polysilicon electrodes 21 are formed in the element separation region 7, respectively penetrating through the interlayer insulating film 23. In addition, after the source contacts 24, the drain contacts 25, and the gate contacts 26 are formed, the respective contacts 24, 25, and 26 are connected to wiring (not shown). Through the above process, the semiconductor device 45 according to the fourth preferred embodiment of the present invention is manufactured.

As above, in the semiconductor device 45, the n$^+$-type source regions 46 and the n$^+$-type drain regions 47 are formed, of the polysilicon containing n-type impurities buried in the high-concentration region trenches 50, uniformly up to a depth to reach an upper portion of the BOX layer 3 from the surface of the n$^-$-type active layer 4. Thus, the channel width can be secured across the entire area of the n$^-$-type channel regions 15.

Also, in the semiconductor device 45, electric lines of force in the n$^+$-type source regions 46 and electric lines of force in the n$^+$-type drain regions 47 can be made constant thoroughly from the surface of the n$^-$-type active layer 4 to an upper portion of the BOX layer 3. Variation in current flowing through the n$^+$-type source regions 46 and the n$^+$-type drain regions 47 can thereby be effectively suppressed. As a result, an increase in dynamic resistance value of the semiconductor device 45 can be effectively suppressed.

Next, a semiconductor device 60 according to a fifth preferred embodiment of the present invention will be described with reference to FIG. 15 and FIG. 16.

Figure 15:
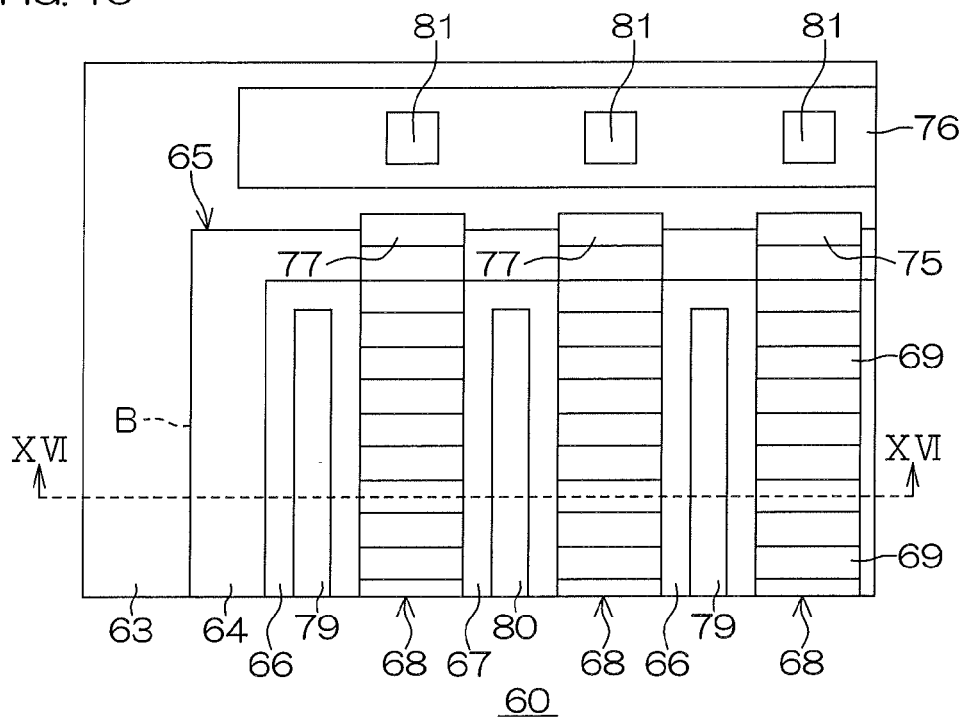
FIG. 15 is an enlarged schematic plan view of a semiconductor device according to a fifth preferred embodiment of the present invention.
Figure 16:
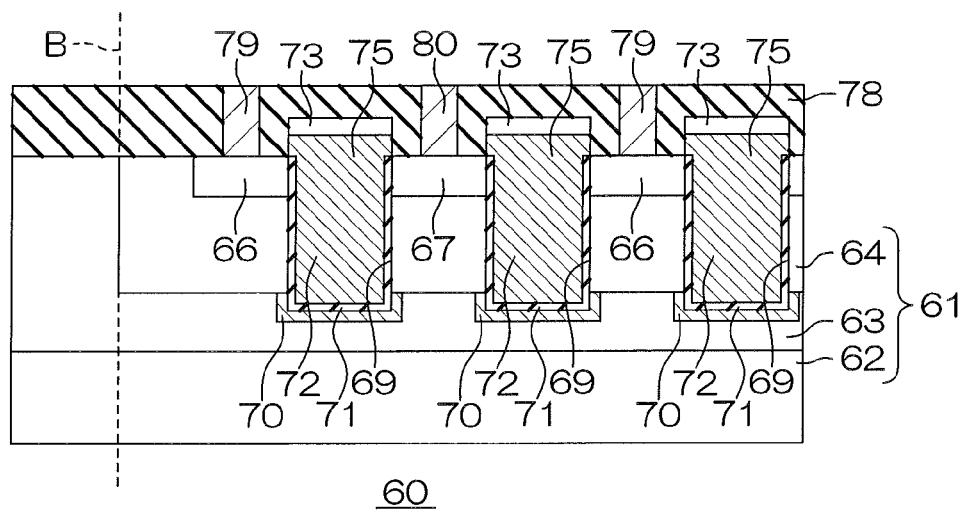
FIG. 16 is a sectional view taken along a section line XVI-XVI in FIG. 15.

FIG. 15 is an enlarged schematic plan view of the semiconductor device 60 according to the fifth preferred embodiment of the present invention. FIG. 16 is a sectional view taken along a section line XVI-XVI in FIG. 15.

The semiconductor device 60 includes an epitaxial substrate 61 being an example of a semiconductor layer of the present invention. The epitaxial substrate 61 includes a p-type semiconductor substrate 62 and a p-type epitaxial layer 63 formed on the semiconductor substrate 62 and having a lower concentration than that of the semiconductor substrate 62. The semiconductor substrate 62 is, for example, a silicon substrate, and its impurity concentration is $1.0 \times 10^{17}$ cm$^{-3}$ to $1.0 \times 10^{19}$ cm$^{-3}$. The epitaxial layer 63 is formed with a layer thickness of, for example, 3 μm to 10 μm, and its impurity concentration is $5.0 \times 10^{14}$ cm$^{-3}$ to $5.0 \times 10^{15}$ cm$^{-3}$. In the epitaxial layer 63, an n$^-$-type well region 64 that demarcates an element forming region 65 from an outer peripheral region is formed.

In the present preferred embodiment, a description will be given of an n$^-$-type well region 64 formed in a rectangular shape in a plan view observed in the direction of a normal to the surface of the epitaxial layer 63 as an example of the n$^-$-type well region. A bottom portion of the n$^-$-type well region 64 is formed at a depth position of 0.5 μm to 5 μm from the surface of the epitaxial layer 63. The impurity concentration of the n$^-$-type well region 64 is $3.0 \times 10^{15}$ cm$^{-3}$ to $5.0 \times 10^{16}$ cm$^{-3}$.

Similar to the semiconductor device 1 in the first preferred embodiment described above, the n$^-$-type well region 64 includes pluralities of n$^+$-type source regions 66 and n$^+$-type drain regions 67 formed transversally spaced apart in the surface of the epitaxial layer 63 and a gate trench group 68 composed of a plurality of gate trenches 69 each formed so as to extend across the n$^+$-type source region 66 and the n$^+$-type drain region 67 and arrayed at an interval from each other.

The n$^+$-type source regions 66 and the n$^+$-type drain regions 67 are formed in a stripe shape in a plan view, and are alternately arrayed at an interval from each other. The n$^+$-type source regions 66 and the n$^+$-type drain regions 67 are formed so that one-side ends and the other-side ends in their longitudinal direction are all located at positions spaced at a constant distance from a boundary B between the n$^-$-type well region 64 and the epitaxial layer 63.

The n$^+$-type source regions 66 and the n$^+$-type drain regions 67 are formed with the same depth in the surface of the n$^-$-type well region 64. Respective bottom portions of the n$^+$-type source regions 66 and the n$^+$-type drain regions 67 are formed, for example, up to a depth to reach 0.2 μm to 1.0 μm from the surface of the n$^-$-type well region 64. The impurity concentration of the n$^+$-type source regions 66 and the n$^+$-type drain regions 67 is, for example, $1.0 \times 10^{19}$ cm$^{-3}$ to $1.0 \times 10^{21}$ cm$^{-3}$.

Similar to the n$^+$-type source regions 66 and the n$^+$-type drain regions 67, the gate trench groups 68 are arrayed in a stripe shape in a plan view, and are formed transversally spaced apart in the surface of the epitaxial layer 63. That is, the gate trench groups 63 are respectively formed in regions between the n$^+$-type source regions 66 and the n$^+$-type drain regions 67 alternately arrayed at an interval from each other.

The gate trenches 69 in the gate trench group 68 are formed with the same width as the interval between the n$^+$-type source region 66 and the n$^+$-type drain region 67, and formed so as to be sandwiched in a pair of the n$^+$-type source region 66 and the n$^+$-type drain region 67. In other words, the n$^+$-type source regions 66 and the n$^+$-type drain regions 67 are formed so as to respectively contact end portions of the gate trenches 69, and are completely separated by the gate trenches 69.

Also, the gate trenches 69 are formed at positions extending across the respective end portions in the longitudinal direction of the n$^+$-type source region 66 and the n$^+$-type drain region 67. The n$^+$-type source region 66 and the n$^+$-type drain region 67 are thereby, at said end portions, completely separated by the gate trenches 69.

Further, the gate trench group 68 includes sub-trenches 77 formed at both end portions in the longitudinal direction of the gate trench group 68 so as to extend across the boundary B between the n$^-$-type well region 64 and the epitaxial layer 63. The sub-trenches 77 do not extend directly across the n$^+$-type source region 66 and the n$^+$-type drain region 67, but are formed so as to prevent the n$^+$-type source region 66 and the n$^+$-type drain region 67 from conducting in a region between said end portions and the boundary B between the n$^-$-type well region 64 and the epitaxial layer 63.

The gate trenches 69 are formed in a manner dug down in the depth direction from the surface of the n$^-$-type well region 64. Also, bottom portions of the gate trenches 69 are, in a sectional view, formed so as to reach the epitaxial layer 63, penetrating through a bottom portion of the n$^-$-type well region 64. Also, the respective gate trenches 69 are formed with a constant interval therebetween along their depth direction. That is, side surfaces of the respective gate trenches 69 are formed so as to be substantially perpendicular (have an angle of 90°) with respect to the surface of the epitaxial layer 63.

At parts where the gate trenches 69 and the epitaxial layer 63 are in contact, p-type impurity regions 70 having a higher concentration than that of the epitaxial layer 63 are formed. The impurity concentration of the p-type impurity regions 70 is, for example, $5.0 \times 10^{16}$ cm$^{-3}$ to $1.0 \times 10^{18}$ cm$^{-3}$.

A gate insulating film 71 is formed so as to cover the side surfaces and bottom portions of the gate trenches 69 and the surface of the n$^-$-type well region 64 between the respective gate trenches 69. The gate insulating film 71 is, for example, a silicon oxide film formed by oxidizing the surface of the n$^-$-type well region 64. In addition, the film thickness of the gate insulating film 71 is, for example, a few nm to 100 nm, but can be appropriately changed according to the specification of the semiconductor device 60.

The gate trench 69 is filled with a gate electrode 72 via the gate insulating film 71. The gate electrode 72 is made of, for example, an electrode material including polysilicon doped with p-type impurities. The impurity concentration of the gate electrode 72 is, for example, $1.0 \times 10^{19}$ cm$^{-3}$ to $5.0 \times 10^{20}$ cm$^{-3}$.

In a region of the gate trench group 68 sandwiched by adjacent gate trenches 69, an n$^-$-type channel region 74 made of the n$^-$-type well region 64 and having a channel length along a direction extending from the n$^+$-type drain region 67 to the n$^+$-type source region 66 is formed. In a region where no gate trench 69 is formed, a gate electrode 72 formed in the surface of the n$^-$-type well region 64 via the gate insulating film 71 faces the n$^-$-type channel region 74.

Similar to the semiconductor device 1 in the first preferred embodiment described above, the respective gate trenches 69 are formed with an interval therebetween, that is, a thickness of the n$^-$-type channel region 74 in a plan view, not more than two times the width of a depletion layer to be generated due to a built-in potential between the n$^-$-type channel region 74 and the gate electrode 72.

At both end-portion sides in the longitudinal direction of the gate trench groups 68 in the outer peripheral region of the element forming region 65, rectangular-shaped contact regions 76 are formed. A gate wiring 75 is formed so as to cover the contact regions 76 and the region where the gate trench groups 68 are formed. The gate wiring 75 is formed so as to extend across a plurality of gate electrodes 72, and serves as a common wiring to the plurality of gate electrodes 72. The gate wiring 75 is formed of the same material as that of the gate electrodes 72.

Moreover, an interlayer insulating film 78 is formed so as to cover the whole of the element forming region 65 and the outer peripheral region of the element forming region 65.

In the element forming region 65, source contacts 79 and drain contacts 80 to connect the n$^+$-type source regions 66 and the n$^+$-type drain regions 67 are formed respectively penetrating through the interlayer insulating film 78. The source contacts 79 and the drain contacts 80 are in ohmic contact with the n$^+$-type source regions 66 and the n$^+$-type drain regions 67, respectively.

Also, in the contact region 76, gate contacts 81 to connect the gate wiring 75 are formed on the gate wiring 75, penetrating through the interlayer insulating film 78. The gate contacts 81 are thereby connected to the gate electrodes 72 via the gate wiring 75.

Next, a manufacturing process of the semiconductor device 60 will be described with reference to FIG. 17A to FIG. 17I. FIG. 17A to FIG. 17I are sectional views for explaining an example of the manufacturing process of the semiconductor device of FIG. 15.

Figure 17A:
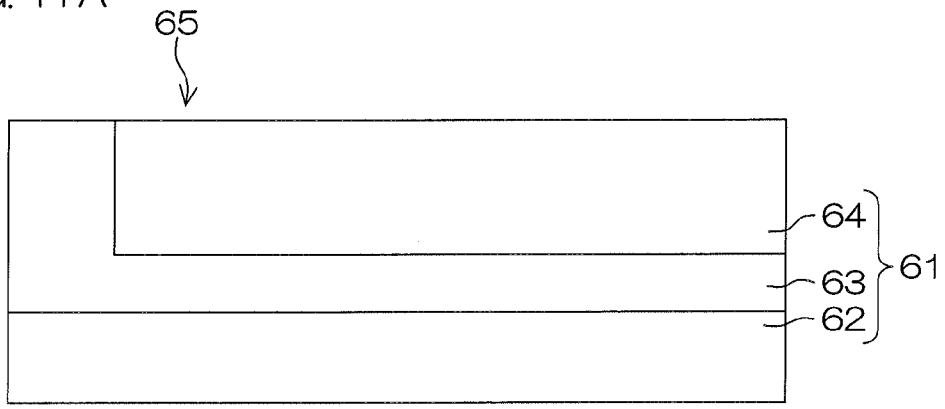
FIG. 17A to FIG. 17I are sectional views for explaining an example of a manufacturing process of the semiconductor device of FIG. 15.

For manufacturing the semiconductor device 60, as shown in FIG. 17A, an epitaxial substrate 61 is formed. Next, an ion implantation mask (not shown) selectively having an opening in a region where the n$^-$-type well region 64 needs to be formed is formed. Then, n-type impurities are doped via said ion implantation mask. The n$^-$-type well region 64 that demarcates the element forming region 65 from the outer peripheral region is thereby formed in the epitaxial layer 63. After the n$^-$-type well region 64 is formed, the ion implantation mask is removed.

Figure 17B:
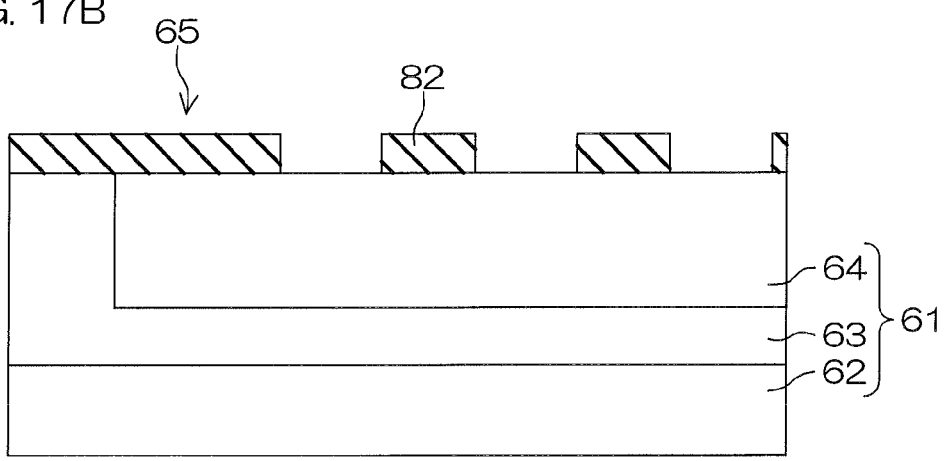

Next, as shown in FIG. 17B, a hard mask 82 selectively having openings in regions where the gate trenches 69 need to be formed in the surface of the n$^-$-type well region 64 is formed.

Figure 17C:
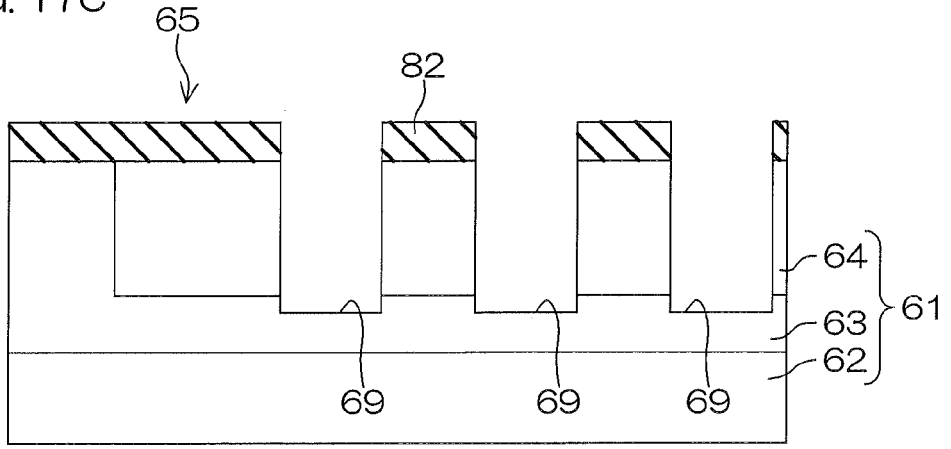

Next, as shown in FIG. 17C, by applying an etching processing to the n$^-$-type well region 64 via the hard mask 82, gate trenches 69 are formed. At this time, the respective gate trenches 69 are formed with a constant interval therebetween along their depth direction. Also, bottom portions of the gate trenches 69 are, in a sectional view, formed so as to reach the epitaxial layer 63, penetrating through a bottom portion of the n$^-$-type well region 64.

Figure 17D:
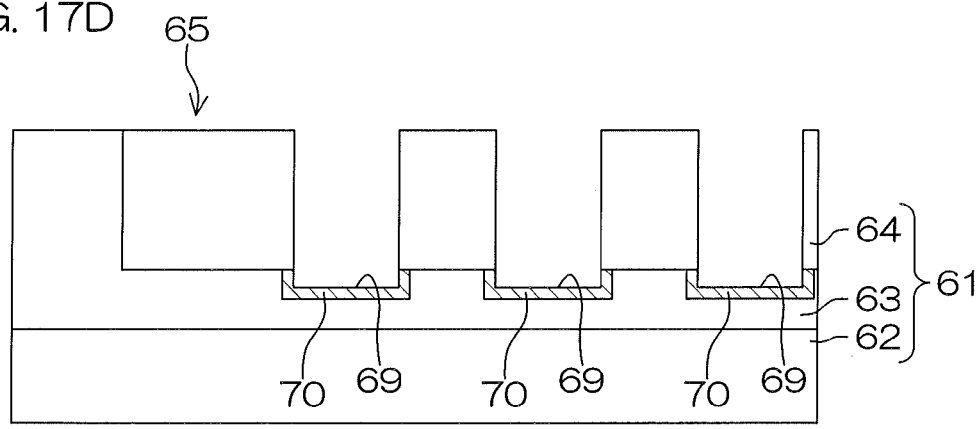

Next, as shown in FIG. 17D, by doping p-type impurities into the parts where the gate trenches 69 and the epitaxial layer 63 are in contact using the hard mask 82 as an ion implantation mask, p-type impurity regions 70 having a higher concentration than that of the epitaxial layer 63 are formed. After the p-type impurity regions 70 are formed, the hard mask 82 is removed.

Figure 17E:
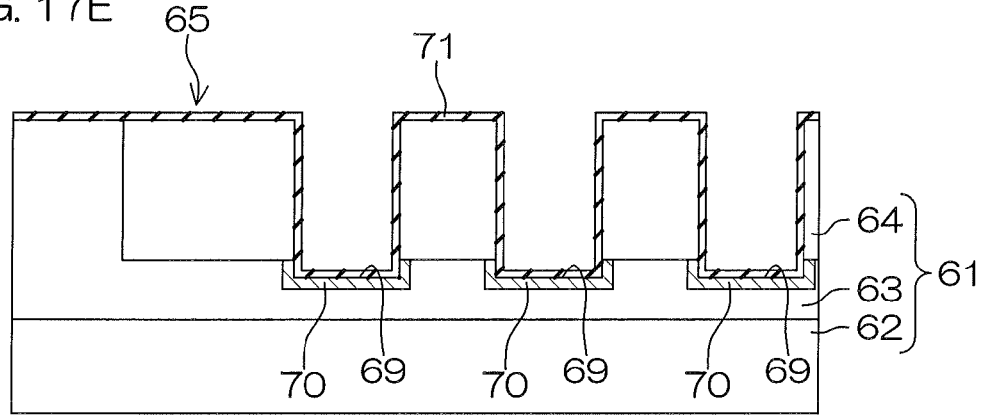

Next, as shown in FIG. 17E, as a result of a thermal oxidization processing being applied to the surface of the n$^-$-type well region 64 (epitaxial layer 63) including bottom surfaces and side surfaces of the gate trenches 69, a gate insulating film 71 is formed.

Figure 17F:
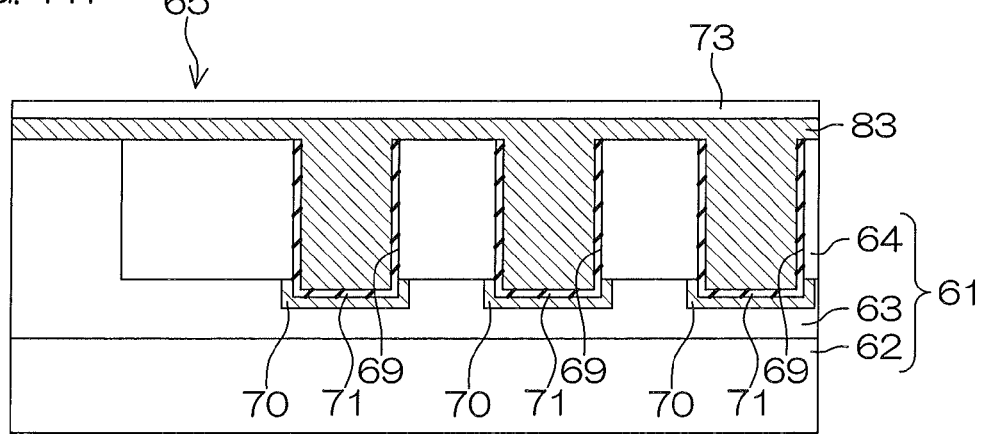

Next, as shown in FIG. 17F, a polysilicon layer 83 is formed so as to fill back the gate trenches 69 and cover the surface of the epitaxial layer 63 and the n$^-$-type well region 64. Next, into the polysilicon layer 83, p-type impurities are diffused so as to provide an opposite polarity to that of the n$^-$-type well region 64. The diffusion of p-type impurities can be performed, for example, by doping p-type impurities at a dose amount on the order of $1.0 \times 10^{15}$ cm$^{-2}$ into the polysilicon layer 83 by an ion implantation method and then applying a thermal diffusion processing until the p-type impurities reach the bottom portions of the gate trenches 69.

Next, on the gate trenches 69, for example, a silicide film 73 is formed by a sputtering method. By forming the silicide film 73, gate electrodes 72 and a gate wiring 75 that are to be formed later can be reduced in resistance value, and mixing of n-type impurities to be doped later in the gate electrodes 72 and the gate wiring 75 can be prevented.

Figure 17G:
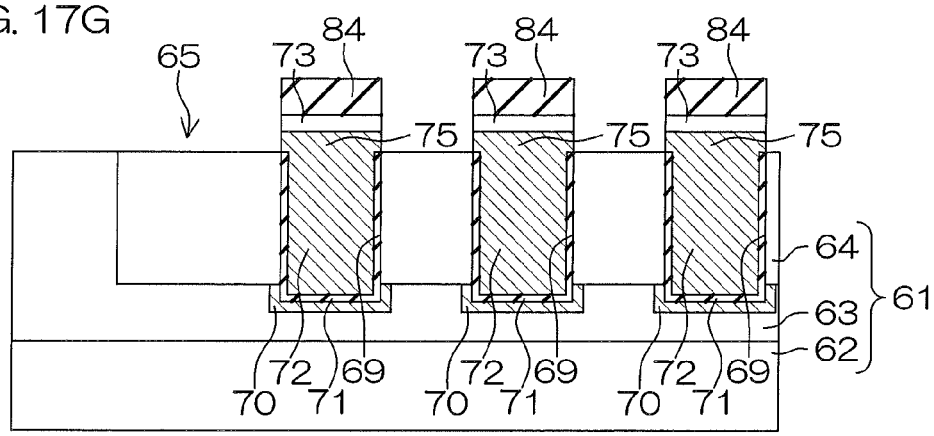

Next, as shown in FIG. 17G, a resist mask 84 to cover regions where the gate electrodes 72 and the gate wiring 75 need to be formed is selectively formed on the silicide film 73. Then, an etching processing is applied via openings of the resist mask 84 to unnecessary parts of the silicide film 73, the polysilicon layer 83, and the gate insulating film 71. The gate electrodes 72 and the gate wiring 75 are thereby formed. After the gate electrodes 72 and the gate wiring 75 are formed, the resist mask 84 is removed.

Figure 17H:
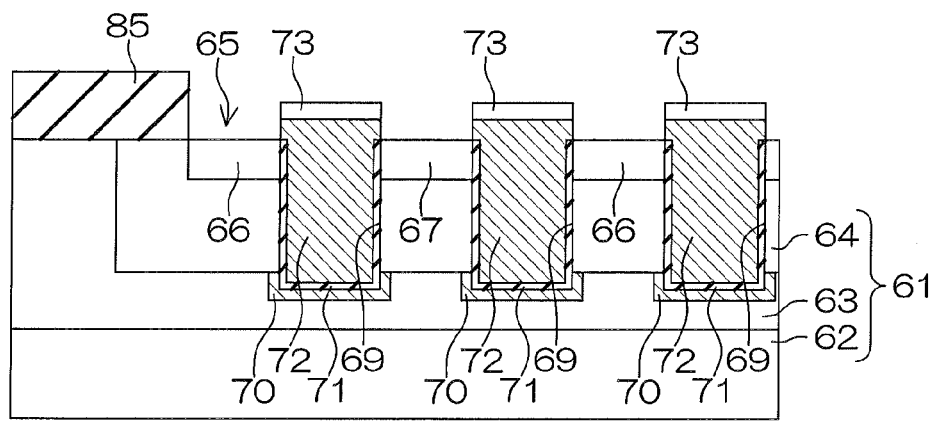

Next, as shown in FIG. 17H, an ion implantation mask 85 to selectively cover a region other than the regions where the n$^+$-type source regions 66 and the n$^+$-type drain regions 67 are formed is formed. Then, n-type impurities are diffused via the ion implantation mask 85 and the silicide film 73. The diffusion of n-type impurities can be performed, for example, by doping n-type impurities at a dose amount on the order of $1.0 \times 10^{15}$ cm$^{-2}$ to $5.0 \times 10^{15}$ cm$^{-2}$ into parts where the n$^-$-type well region 64 is exposed and then applying a thermal diffusion processing. The n$^+$-type source regions 66 and the n$^+$-type drain regions 67 are thereby formed. The ion implantation mask 85 is removed before applying the thermal diffusion processing.

Figure 17I:
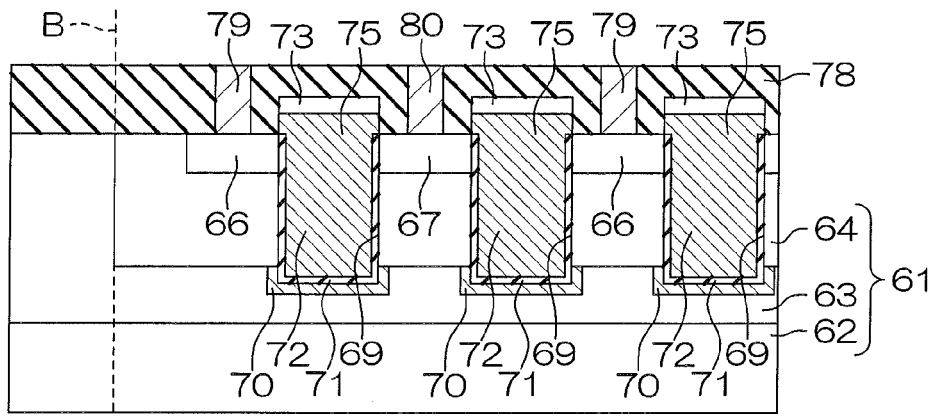

Next, as shown in FIG. 17I, an interlayer insulating film 78 is formed so as to cover the whole of the element forming region 65 and the outer peripheral region of the element forming region 65. Next, source contacts 79 and drain contacts 80 to connect the n$^+$-type source regions 66 and the n$^+$-type drain regions 67 are formed in the element forming region 65 and gate contacts 81 to connect the gate electrodes 72 and the gate wiring 75 are formed in the contact regions 76, respectively penetrating through the interlayer insulating film 78. In addition, after the source contacts 79, the drain contacts 80, and the gate contacts 81 are formed, the respective contacts 79, 80, and 81 are connected to wiring (not shown). Through the above process, the semiconductor device 60 according to the fifth preferred embodiment of the present invention is manufactured.

As above, in the semiconductor device 60 according to the fifth preferred embodiment, the same effects as those of the semiconductor device 1 described above can be provided, unlike the semiconductor devices 1, 32, 43, and 45 according to the first to fourth preferred embodiments described above, even without forming the expensive SOI substrate 5.

Also, in the semiconductor device 60, because the p-type impurity regions 70 are formed at the parts where the gate trenches 69 and the epitaxial layer 63 are in contact, a reduction in the p-type concentration as a result of the p-type impurities added to the epitaxial layer 63 being absorbed in the gate insulating film 71 can be effectively suppressed. An inversion of the epitaxial layer 63 at the part to contact the gate trench 69 to the n-type, which is an opposite polarity, can thereby be suppressed. As a result, the n$^+$-type source region 66 and the n$^+$-type drain region 67 can be effectively suppressed from conducting therebetween via a lower portion of the n$^-$-type well region 64.

Next, a semiconductor device 86 according to a sixth preferred embodiment of the present invention will be described with reference to FIG. 18.

Figure 18:
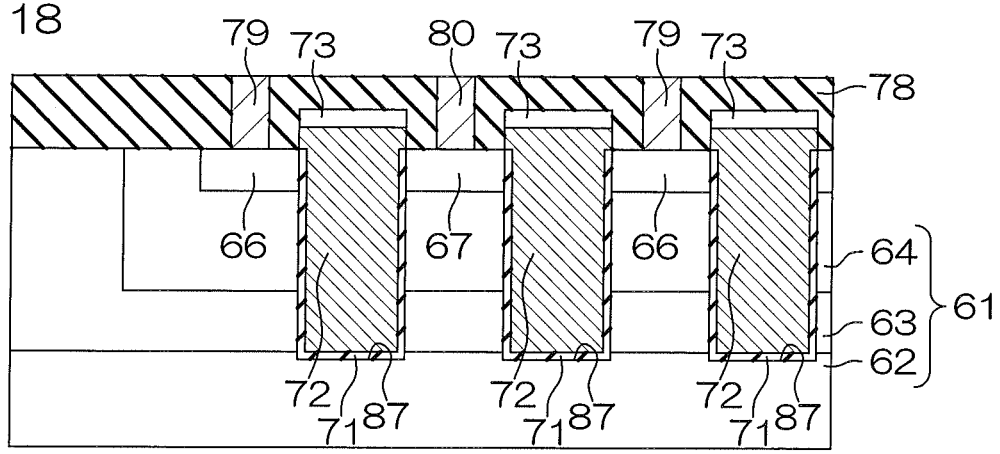
FIG. 18 is a schematic sectional view of a semiconductor device according to a sixth preferred embodiment of the present invention.

FIG. 18 is a schematic sectional view of the semiconductor device 86 according to the sixth preferred embodiment of the present invention. The difference in the semiconductor device 86 from the semiconductor device 60 according to the fifth preferred embodiment described above is that gate trenches 87 are formed in place of the gate trenches 69. Other arrangements are equivalent to those of the semiconductor device 60. In FIG. 18, parts corresponding to the respective parts shown in FIG. 16 described above will be denoted by the same reference signs, and descriptions thereof will be omitted.

Unlike the gate trenches 69 described above, bottom portions of the gate trenches 87 in the semiconductor device 86 are, in a sectional view, formed so as to reach the semiconductor substrate 62, penetrating through a bottom portion of the epitaxial layer 63.

As above, according to the arrangement of the semiconductor device 86, by using the semiconductor substrate 62 having a higher concentration than that of the epitaxial layer 63, the same effects as those of the semiconductor device 60 described above can be provided, even without forming the p-type impurity regions 70 as in the semiconductor device 60 described above.

Also, because the p-type impurity regions 70 need not to be formed, the manufacturing process for the semiconductor device 60 described above can be simplified (that is, the step of FIG. 17D can be omitted).

Next, a semiconductor device 91 according to a seventh preferred embodiment of the present invention will be described with reference to FIGS. 19A and 19B.

Figures 19A, 19B:
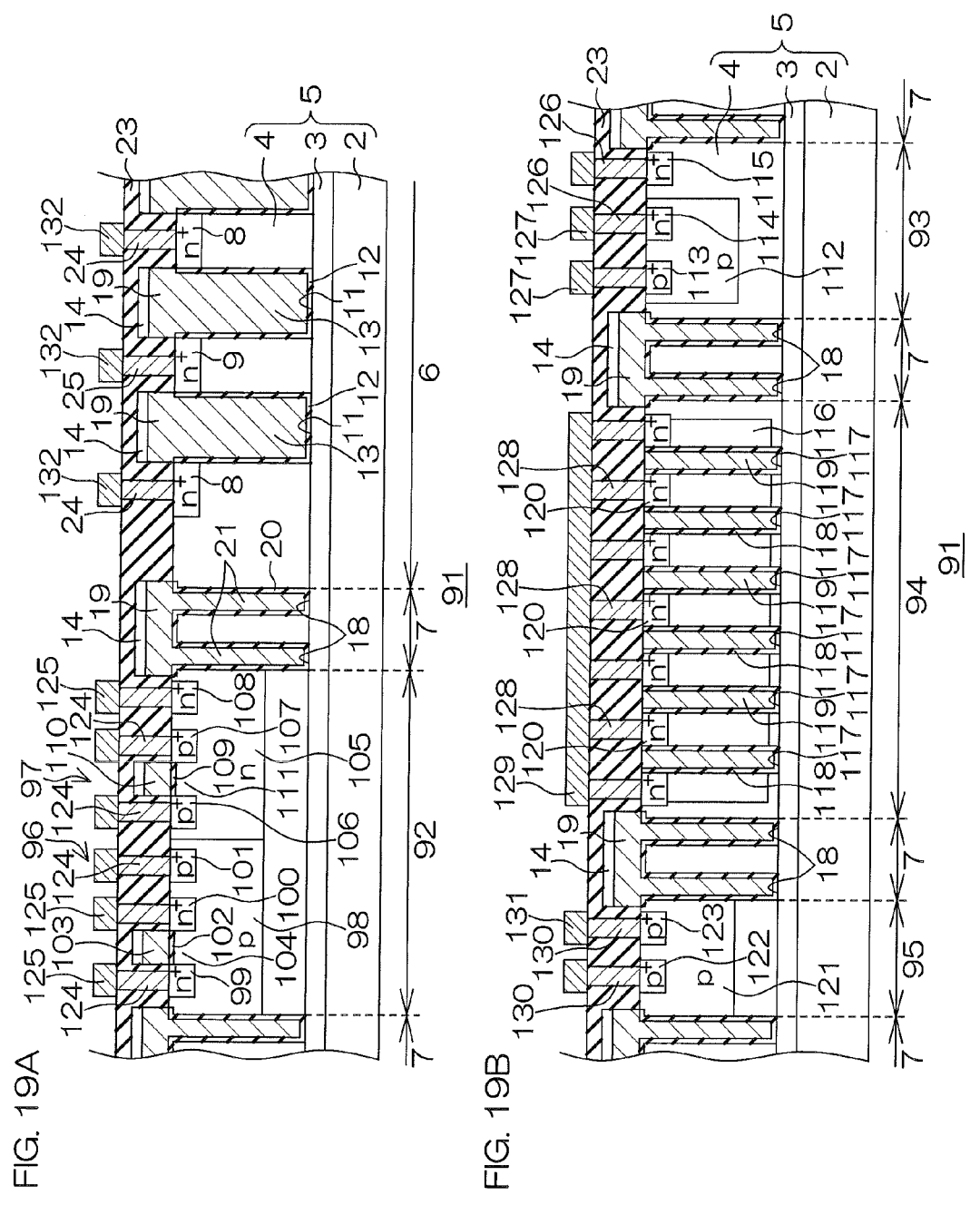

FIGS. 19A and 19B show schematic sectional views of the semiconductor device 91 according to the seventh preferred embodiment of the present invention. FIG. 19A is a schematic sectional view showing the first element forming region 6 according to the first preferred embodiment described above and a second element forming region 92, and FIG. 19B is a schematic sectional view showing a third element forming region 93, a fourth element forming region 94, and a fifth element forming region 95. In addition, the arrangement of the first element forming region 6 is as in the first preferred embodiment described above, and will be therefore denoted by the same reference signs, and descriptions thereof will be omitted.

The semiconductor device 91 includes a first element forming region 6 in which an L-MOSSIT is formed, a second element forming region 92 in which a CMOS is formed, a third element forming region 93 in which a bipolar transistor is formed, a fourth element forming region 94 in which capacitance is formed, and a fifth element forming region 95 in which resistance is formed. The first to fifth element forming regions 6, 92, 93, 94, and 95 are demarcated from each other by the element separation region 7.

First, the second element forming region 92 will be described with reference to FIG. 19A. The second element forming region 92 includes an n-MOS region 96 and a p-MOS region 97.

In the surface of the n⁻-type active layer 4 in the n-MOS region 96, a p-type well region 98 is formed. The p-type well region 98 is formed, for example, deeper than the n⁺-source regions 8 and the n⁺-drain regions 9 in the first element forming region 6, and formed up to a depth to reach 0.8 μm to 3 μm from the surface of the n⁻-type active layer 4. The impurity concentration of the p-type well region 98 is, for example, $1.0 \times 10^{16}$ cm$^{-3}$ to $1.0 \times 10^{17}$ cm$^{-3}$.

A side surface close to the element separation region 7 of the p-type well region 98 is in contact with aside surface of the element separating trench 18, and a side surface at the opposite side to the element separation region 7 of the p-type well region 98 is in contact with a side surface of an n-type well region 105 to be described later.

In an inner region of the p-type well region 98, an n-MOS source region 99 and an n-MOS drain region 100 that are of the n⁺-type and a p⁺-type well contact region 101 are selectively formed at an interval from each other.

The n-MOS source region 99 and the n-MOS drain region 100 are formed with the same depth and the same concentration as those of the n⁺-source regions 8 and the n⁺-drain regions 9 in the first element forming region 6 described above.

The p⁺-type well contact region 101 is formed substantially with the same depth as that of the n-MOS source region 99 and the n-MOS drain region 100. The impurity concentration of the p-type well contact region 101 is, for example, $1.0 \times 10^{19}$ cm$^{-3}$ to $1.0 \times 10^{20}$ cm$^{-3}$.

On the surface of the n⁻-type active layer 4 in the n-MOS region 96, an n-MOS gate electrode 103 is formed via an n-MOS gate oxide film 102, and in a region between the n-MOS source region 99 and the n-MOS drain region 100, an n-MOS channel region 104 of the n-MOS region 96 is formed. That is, the n-MOS gate electrode 103 is formed so as to be opposed to the n-MOS channel region 104 via the n-MOS gate oxide film 102.

The n-MOS gate electrode 103 is formed so as to be integrally continuous with the gate wiring 19 formed in the first element forming region 6. That is, electric power is supplied to the n-MOS gate electrode 103 via the gate contact 26 (refer to FIG. 1 and FIG. 2). On the n-MOS gate electrode 103, a silicide film 14 is formed.

In the surface of the n⁻-type active layer 4 in the p-MOS region 97, an n-type well region 105 is formed. The n-type well region 105 is formed substantially at the same depth as that of the p-type well region 98. The impurity concentration of the n-type well region 105 is, for example, $1.0 \times 10^{16}$ cm$^{-3}$ to $1.0 \times 10^{17}$ cm$^{-3}$.

A side surface close to the element separation region 7 of the n-type well region 105 is in contact with a side surface of the element separating trench 18, and a side surface at the opposite side to the element separation region 7 of the n-type well region 105 is in contact with a side surface of the p-type well region 98.

In an inner region of the n-type well region 105, a p-MOS source region 106 and a p-MOS drain region 100 that are of the p⁺-type and an n⁺-type well contact region 108 are selectively formed at an interval from each other.

The p-MOS source region 106 and the p-MOS drain region 107 are formed substantially with the same depth and the same concentration as those of the p⁺-type well contact region 101 in the n-MOS region 96.

The n⁺-type well contact region 108 is formed with the same depth and the same concentration as those of the n⁺-type source regions 8 and the n⁺-type drain regions 9 in the first element forming region 6 described above.

On the surface of the n⁻-type active layer 4 in the p-MOS region 97, a p-MOS gate electrode 110 is formed via a p-MOS gate oxide film 109, and in a region between the p-MOS source region 106 and the p-MOS drain region 107, a p-MOS channel region 111 of the p-MOS region 97 is formed. That is, the p-MOS gate electrode 110 is formed so as to be opposed to the p-MOS channel region 111 via the p-MOS gate oxide film 109.

Similar to the n-MOS gate electrode 103, the p-MOS gate electrode 110 is formed so as to be integrally continuous with the gate wiring 19 formed in the first element forming region 6. That is, electric power is supplied to the p-MOS gate electrode 110 via the gate contact 26 (refer to FIG. 1 and FIG. 2). On the p-MOS gate electrode 110, a silicide film 14 is formed. In this manner, in the second element forming region 92, a CMOS is formed.

Next, the third element forming region 93 will be described with reference to FIG. 19B. The third element forming region 93 includes a p-type base region 112 formed in the surface of the n⁻-type active layer 4, a p⁺-type base 113 and an n⁺-type emitter 114 selectively formed at an interval from each other in an inner region of the p-type base region 112, and an n⁺-type collector 115 selectively formed in a region outside the p-type base region 112.

The p-type base region 112 is formed, for example, with the same depth and the same concentration as those of the p-type well region 98 in the second element forming region 92. Also, the p⁺-type base 113 is formed with the same depth and the same concentration as those of the p-MOS source region 106 and the p-MOS drain region 107 in the second element forming region 92. Also, the n⁺-type emitter 114 and the n⁺-type collector 115 are formed, for example, with the same depth and the same concentration as those of the n⁺-type source regions 8 and the n⁺-type drain regions 9 in the first element forming region 6. In this manner, in the third element forming region 93, a bipolar transistor is formed.

Next, the fourth element forming region 94 will be described. The fourth element forming region 94 includes a capacitor electrode layer 116 formed in the surface of the n⁻-type active layer 4 and a plurality of capacitor trenches 117 formed by selectively digging down into the surface of the capacitor electrode layer 116.

The capacitor electrode layer 116 is formed spaced at a constant distance from a side surface of the element separating trench 18 of the element separation region 7. The capacitor electrode layer 116 is formed, for example, by n-type diffusion, and its impurity concentration is $1.0 \times 10^{16}$ cm⁻³ to $1.0 \times 10^{20}$ cm⁻³.

The plurality of capacitor trenches 117 are formed with the same shape and the same depth as those of the gate trenches 11 in the first element forming region 6. That is, bottom portions of the plurality of capacitor trenches 117 are formed so as to contact an upper portion of the BOX layer 3, penetrating through a bottom portion of the capacitor electrode layer 116. Moreover, the capacitor trench 117 is filled with a capacitor electrode 119 via a capacitor insulating film 118. The capacitor electrode 119 is formed, for example, with the same material and the same film thickness as those of the gate electrode 13 in the first element forming region 6.

In the surface of the capacitor electrode layer 116 in a region between the plurality of capacitor trenches 117 and a region between the element separating trench 18 and the capacitor trench 117, n⁺-type impurity regions 120 are formed. The n⁺-type impurity regions 120 are formed, for example, with the same depth and the same concentration as those of the n⁺-type source regions 8 and the n⁺-type drain regions 9 in the first element forming region 6. In this manner, in the fourth element forming region 94, capacitance is formed.

Next, the fifth element forming region 95 will be described. The fifth element forming region 95 includes a p-type impurity region 121 formed in the whole of a region demarcated by the element separation region 7 and a first p⁺-type impurity region 122 and a second p⁺-type impurity region 123 selectively formed at an interval from each other in an inner region of the impurity region 121.

The p-type impurity region 121 is formed, for example, with the same depth and the same concentration as those of the p-type well region 98 in the second element forming region 92. Also, the first p⁺-type impurity region 122 and the second p⁺-type impurity region 123 are formed, for example, with the same depth and the same concentration as those of the p-MOS source region 106 and the p-MOS drain region 107 in the second element forming region 92. In this manner, in the fifth element forming region 95, resistance is formed.

Moreover, an interlayer insulating film 23 is formed so as to cover the first to fifth element forming regions 6, 92, 93, 94, and 95.

The source contacts 24, the drain contacts 25, and the gate contacts 26 in the first element forming region 6 are respectively connected to electrodes 132 disposed on the interlayer insulating film 23.

In the second element forming region 92, contacts 124 to connect the n-MOS source region 99, the n-MOS drain region 100, the p⁺-type well contact region 101, the p-MOS source region 106, the p-MOS drain region 107, and the n⁺-type well contact region 108 are connected to each thereof penetrating through the interlayer insulating film 23. The contacts 124 are respectively connected to electrodes 125 disposed on the interlayer insulating film 23.

Also, in the third element forming region 93, contacts 126 to connect the p⁺-type base 113, the n⁺-type emitter 114, and the n⁺-type collector 115 are connected to each thereof through the interlayer insulating film 23. The contacts 126 are respectively connected to electrodes 127 disposed on the interlayer insulating film 23.

Also, in the fourth element forming region 94, contacts 128 to connect the n⁺-type impurity regions 120 are connected to each thereof penetrating through the interlayer insulating film 23. The contacts 128 are respectively connected to electrodes 129 disposed on the interlayer insulating film 23.

Also, in the fifth element forming region 95, contacts 130 to connect the first p⁺-type impurity region 122 and the second p⁺-type impurity region 123 are connected to each thereof penetrating through the interlayer insulating film 23. The contacts 130 are respectively connected to electrodes 131 disposed on the interlayer insulating film 23.

Moreover, in the first element forming region 6, a wiring layer (not shown) is further formed, and electric power is supplied to the first to fifth element forming regions 6, 92, 93, 94, and 95 via said wiring layer.

Such a semiconductor device 91 can be manufactured, for example, by simultaneously forming major parts in the L-MOSSIT manufacturing process described above (FIG. 6A to FIG. 6G), and for the different parts, adding a manufacturing process separately.

As above, according to the semiconductor device 91, because it is possible to simultaneously form an L-MOSSIT and other semiconductor elements, the manufacturing process can be simplified, while a semiconductor device having excellent multi-functionality can be provided. Also, according to the arrangement of the L-MOSSIT, because of extreme ease in mixed mounting as an LSI, a semiconductor device having an extremely high affinity with other semiconductor elements can be provided.

While preferred embodiments of the present invention have been described above, the present invention can also be carried out in other embodiments.

For example, in the first to fourth preferred embodiments described above, a description has been given of the element separating trenches 18 of a double trench structure surrounding the first element forming region 6 in a rectangular shape, however, the shape may be any as long as the first element forming region 6 can be surrounded. Thus, the element separating trenches 18 may have, for example, an oblong shape or an octagonal shape.

Also, the two element separating trenches 18 may be formed with an interval therebetween not less than two times the width of a depletion layer to be generated due to a built-in potential between the $n^-$-type channel region 15 and the gate electrode 13.

Also, in the second preferred embodiment described above, two or more $n^+$-type source intermediate layer 39 may be formed between the $n^+$-type source surface layer 35 and the $n^+$-type source deepest layer 40. That is, an $n^+$-type source region including three or more layers may be formed.

Also, similarly, two or more $n^+$-type drain intermediate layers 41 may be formed between the $n^+$-type drain surface layer 36 and the $n^+$-type drain deepest layer 42. That is, an $n^+$-type drain region including three or more layers may be formed.

Also, in the first to seventh preferred embodiments described above, a description has been given of the arrangement in which the p-type semiconductor substrate 2, 62 is formed, however, this may be an arrangement in which an n-type semiconductor substrate 2, 62 inverted in conductivity type is formed. In this case, the conductivity of other impurity regions etc., is also inverted in the arrangement.

Also, the respective arrangements of the semiconductor devices 1, 32, 43, 45, 60, 86, and 91 described in the first to seventh preferred embodiments described above can be combined within the scope of the matters described in the claims. Various other design modifications can be made within the scope of the matters described in the claims.

The invention claimed is:

1. A semiconductor device comprising:
    a semiconductor layer;
    a plurality of gate trenches formed in the semiconductor layer, each gate trench having one end portion and another end portion;
    source regions having a first conductivity type formed in a surface of the semiconductor layer, the source regions being disposed across the plurality of gate trenches and directly connected with the one end portions of the gate trenches;
    drain regions having a first conductivity type formed in a surface of the semiconductor layer, the drain regions being disposed across the plurality of gate trenches and directly connected with the other end portions of the gate trenches;
    a channel region of a first conductivity type, made of a portion of the semiconductor layer sandwiched by the gate trenches which are adjacent to each other, and having a channel length along a direction extending from one of the drain regions to one of the source regions;
    a gate insulating film;
    a gate electrode buried in the gate trenches via the gate insulating film, the gate electrode extending from a first connecting portion at which the one of the source regions is connected with a source side end portion of the one end portions of the gate trenches to a second connecting portion at which the one of the drain regions is connected with a drain side end portion of the other end portions of the gate trenches; and
    an element separation region surrounding the source regions and the drain regions, wherein
    the channel region has a thickness in a plan view, not more than two times a width of a depletion layer to be generated due to a built-in potential between the channel region and the gate electrode, and
    the source regions and the drain regions are each formed in a stripe shape in the plan view such that one-side and another-side ends thereof in a longitudinal direction of the stripe shape are all located at positions spaced at a distance, greater than zero, from the element separation region, and the source regions are alternately arranged with the drain regions with intervals between the drain regions and the source regions,
    the semiconductor device further comprises a sub-trench disposed in the semiconductor layer between the element separation region and at least one of the one-side and another-side ends of the source regions and the drain regions, such that the sub-trench is not directly connected to the source regions and the drain regions.

2. The semiconductor device according to claim 1, wherein the interval of the gate trenches adjacent to each other is constant along the depth direction of the gate trenches adjacent to each other.

3. The semiconductor device according to claim 1, wherein the source regions and the drain regions consist of a plurality of layers including a surface layer exposed from the surface of the semiconductor layer and a buried layer formed at an interval lower than the surface layer.

4. The semiconductor device according to claim 3, wherein the buried layer includes a plurality of buried layers formed at an interval from each other until reaching a bottom portion of the gate trenches.

5. The semiconductor device according to claim 1, wherein the source regions and the drain regions are formed evenly until reaching a bottom portion of the gate trenches from the surface of the semiconductor layer.

6. The semiconductor device according to claim 5, wherein the source regions and the drain regions are made of polysilicon buried in the semiconductor layer.

7. The semiconductor device according to claim 1, wherein the drain regions are formed so as to have a predetermined interval with an end portion of the gate trenches.

8. The semiconductor device according to claim 1, wherein the source regions and the drain regions are each formed so as to contact an end portion of the gate trenches.

9. The semiconductor device according to claim 1, wherein the semiconductor layer is made of n-type silicon, and the gate electrode is made of p-type polysilicon.

10. The semiconductor device according to claim 1, wherein in the plan view, the plurality of gate trenches are constructed by gate trenches formed in rectangle shapes having a length corresponding to the channel length and that are arrayed at equal intervals.

11. The semiconductor device according to claim 1, wherein the semiconductor layer is made of an SOI substrate including a BOX layer, a support substrate and an active layer stacked on the support substrate via the BOX layer, and
    the gate trenches are formed so as to reach the BOX layer from a surface of the active layer.

12. The semiconductor device according to claim 1, wherein the semiconductor layer is made of a substrate including a second conductivity-type semiconductor layer and a first conductivity-type well formed in the second conductivity-type semiconductor layer, and
    the gate trenches are formed so as to reach the second conductivity-type semiconductor layer, penetrating through the first conductivity-type well.

13. The semiconductor device according to claim 12, wherein the second conductivity-type semiconductor layer includes another substrate and an epitaxial layer formed with the first conductivity-type well, the epitaxial layer having a lower concentration than that of the another substrate, and the epitaxial layer includes a high-concentration region formed in a first region to contact the gate trenches, having an impurity concentration higher than that of a region other than the first region.

14. The semiconductor device according to claim 1, further comprising:

a source contact in ohmic contact with the source region; and a drain contact in ohmic contact with the drain regions.

15. The semiconductor device according to claim 1, wherein the semiconductor layer is formed in a rectangle shape in the plan view so that the rectangle shape has longitudinal sides extending in a longitudinal direction, and the source regions are alternately arranged with the drain regions along the longitudinal direction.

16. A method for manufacturing a semiconductor device comprising:

a step of forming a plurality of gate trenches in a first conductivity-type region of a semiconductor layer selectively having the first conductivity-type region, each gate trench having one end portion and another end portion, an element separating trench in the first conductivity-type region of the semiconductor layer, and sub-trench in the semiconductor layer;

a step of forming drain regions of a first conductivity type in a surface of the semiconductor layer so that the drain regions are disposed between the plurality of gate trenches and directly connect with the other end portions of the gate trenches, and forming source regions of a first conductivity type in the surface of the semiconductor layer so that the source regions are disposed between the plurality of gate trenches and directly connect with the one end portions of the gate trenches by doping impurity ions of a first conductivity type into the semiconductor layer so that, in a plan view observed in a direction of a normal to the surface of the semiconductor layer, the first conductivity-type region sandwiched by the gate trenches which are adjacent to each other, becomes a channel region having a channel length along a direction extending from a first end to a second end of the gate trenches; and a step of burying a gate electrode in the gate trenches via a gate insulating film, the gate electrode extending from a first connecting portion at which the source regions are connected with a source side end portion of the one end portions of the gate trenches to a second connecting portion at which the drain regions are connected with a drain side end portion of the other end portions of the gate trenches, and forming an element separation region in the element separating trench so as to surround the source regions and the drain regions, wherein the plurality of gate trenches are formed so that the channel region has a thickness in the plan view, not more than two times a width of a depletion layer to be generated due to a built-in potential between the channel region and the gate electrode, the source regions and the drain regions are each formed in a stripe shape in the plan view such that one-side and another-side ends thereof in a longitudinal direction of the stripe shape are all located at positions spaced at a distance, greater than zero, from the element separation region, and the source regions are alternately arranged with the drain regions with intervals between the drain regions and the source regions, and the sub-trench is disposed between the element separation region and at least one of the one-side and another-side ends of the source regions and the drain regions, such that the sub-trench is not directly connected to the source regions and the drain regions.

17. The method for manufacturing a semiconductor device according to claim 16, wherein the step of forming the source regions and the drain regions comprises:

a step of forming a surface layer exposed from the surface of the semiconductor layer by doping impurity ions of a first conductivity type into the semiconductor layer at a first acceleration energy; and a step of forming a buried layer lower than the surface layer by doping impurity ions of a first conductivity type into the semiconductor layer at a second acceleration energy higher than the first acceleration energy.

18. The method for manufacturing a semiconductor device according to claim 17, wherein the buried layer includes a plurality of buried layers formed so as to have an interval from each other until reaching a bottom portion of the gate trenches by changing the second acceleration energy in steps.

19. The method for manufacturing a semiconductor device according to claim 16, wherein the step of forming the plurality of gate trenches includes a step of forming the gate trenches adjacent to each other with a constant interval therebetween along their depth direction.

20. The method for manufacturing a semiconductor device according to claim 16, wherein the semiconductor layer is made of an SOI substrate including a BOX layer, a support substrate and an active layer stacked on the support substrate via the BOX layer to provide the first conductivity-type region, and the step of forming the plurality of gate trenches includes a step of forming the gate trenches so as to reach the BOX layer from a surface of the active layer.

21. The method for manufacturing a semiconductor device according to claim 16, wherein the semiconductor layer is made of a substrate including a second conductivity-type semiconductor layer and a first conductivity-type well formed in the second conductivity-type semiconductor layer to provide the first conductivity-type region, and the step of forming the plurality of gate trenches includes a step of forming the gate trenches so as to reach the second conductivity-type semiconductor layer, penetrating through the first conductivity-type well.

22. The method for manufacturing a semiconductor device according to claim 21, wherein the second conductivity-type semiconductor layer includes another substrate and an epitaxial layer formed with the first conductivity-type well, having a lower concentration than that of the another substrate, and the method for manufacturing a semiconductor device further comprises a step of doping impurity ions of a second conductivity type into the epitaxial layer exposed from the gate trenches after formation of the plurality of gate trenches.

23. A semiconductor device comprising:

a semiconductor layer;

a plurality of gate trenches formed in the semiconductor layer, each gate trench having one end portion and another end portion;

source regions having a first conductivity type formed in a surface of the semiconductor layer, the source regions being disposed between the plurality of gate trenches and directly connected with the one end portions of the gate trenches;

drain regions having a first conductivity type formed in a surface of the semiconductor layer, the drain regions being disposed between the plurality of gate trenches and directly connected with the other end portions of the gate trenches;

a channel region of the first conductivity type and made of the semiconductor layer so as to be sandwiched by adjacent gate trenches of the gate trenches which are adjacent to each other, the channel region extending from one of the drain regions to one of the source regions;

a gate insulating film;

a gate electrode buried in the gate trenches via the gate insulating film, the gate electrode extending from a first connecting portion at which the one of the source regions is connected with a source side end portion of the one end portions of the gate trenches to a second connecting portion at which the one of the drain regions is connected with a drain side end portion of the other end portions of the gate trenches; and an element separation region surrounding the source regions and the drain regions, wherein the channel region has a thickness in a plan view not more than two times a width of a depletion layer to be generated due to a built-in potential between the channel region and the gate electrode, and the source regions and the drain regions are each formed in a stripe shape in the plan view such that one-side and another-side ends thereof in a longitudinal direction of the stripe shape are all located at positions spaced at a distance, greater than zero, from the element separation region, and the source regions are alternately arranged with the drain regions with intervals between the drain regions and the source regions, the semiconductor device further comprises a sub-trench disposed in the semiconductor layer between the element separation region and at least one of the one-side and another-side ends of the source regions and the drain regions, such that the sub-trench is not directly connected to the source regions and the drain regions.

* * * * *